United States Patent [19]

Iwamatsu et al.

[11] Patent Number: 5,652,453
[45] Date of Patent: Jul. 29, 1997

[54] SEMICONDUCTOR DEVICE WITH A SEMICONDUCTOR LAYER FORMED ON AN INSULATING FILM AND MANUFACTURING METHOD THEREOF

[75] Inventors: Toshiaki Iwamatsu; Yasuo Inoue, both of Hyogo, Japan

[73] Assignee: Mitsubishi Denki Kabushiki Kaisha, Tokyo, Japan

[21] Appl. No.: 557,247

[22] Filed: Nov. 14, 1995

[30] Foreign Application Priority Data

Jun. 6, 1995 [JP] Japan .................... 7-139449

[51] Int. Cl.⁶ ............................................ H01L 27/01
[52] U.S. Cl. ........................ 257/347; 257/354; 257/623
[58] Field of Search .................... 257/347, 349, 257/354, 382, 623, 900

[56] References Cited

U.S. PATENT DOCUMENTS

| | | | |
|---|---|---|---|
| 4,753,896 | 6/1988 | Matloubian | 437/29 |
| 4,807,013 | 2/1989 | Manocha | 257/900 |
| 4,956,307 | 9/1990 | Pollack et al. | 437/40 |
| 5,023,197 | 6/1991 | Haond et al. | 427/40 |
| 5,039,621 | 8/1991 | Pollack | 437/21 |
| 5,089,870 | 2/1992 | Haond | 257/347 |

FOREIGN PATENT DOCUMENTS 60-258957  12/1985  Japan .

OTHER PUBLICATIONS

Electronics Letters 18th Aug. 1983 vol. 19, No. 17, pp. 684 et seq.

*Primary Examiner*—Mark V. Prenty
*Attorney, Agent, or Firm*—Lowe, Price, LeBlanc & Becker

[57] ABSTRACT

A semiconductor device which can prevent formation of a parasitic transistor and degradation in its threshold voltage is obtained. In the semiconductor device, a sidewall insulating film the width of which is increased toward its lower portion is formed on a side wall of a semiconductor layer, and a gate electrode layer is formed such that it extends on the semiconductor layer and the sidewall insulating film.

5 Claims, 40 Drawing Sheets

SEMICONDUCTOR DEVICE WITH A SEMICONDUCTOR LAYER FORMED ON AN INSULATING FILM AND MANUFACTURING METHOD THEREOF

BACKGROUND OF THE INVENTION

1. Field of the Invention

The present invention relates to a semiconductor device and a manufacturing method thereof, and particularly to a semiconductor device including a semiconductor layer formed on an insulating film and a manufacturing method thereof.

2. Description of the Background Art

In order to contemplate a high performance semiconductor, an attempt has been done to manufacture a semiconductor integrated circuit having small stray capacitance by separating circuit elements by dielectric substance. When a transistor is formed in a thin silicon layer formed on an insulating film (referred to as "SOI (Silicon On Insulator) layer" hereinafter), so-called MESA isolation method is employed in order to separate the element circuits.

It has been reported that each transistor isolated by this method has many advantages since it is formed as a completely island-like semiconductor layer. For example, the transistor is not affected by latch up with an adjacent transistor.

FIGS. 39–41 show plan and cross sectional views of an MOS field-effect transistor (referred to as "MOS FET" hereinafter) which is formed in an SOI layer formed by the conventional MESA isolation method. FIG. 39 shows a plan view of the SOI layer MOS FET. Referring to FIG. 39, an SOI layer 103 is formed like an island on a buried oxide film 102. A gate electrode 105 is formed such that it traverses SOI layer 103. A contact hole 190 is formed such that it connects the source and drain of the transistor. A wiring layer 193 is formed such that it electrically contacts the source/drain regions within contact hole 190.

FIG. 40 is a cross sectional view taken along line 600—600 of FIG. 39. Referring to FIG. 40, buried oxide film 102 is formed on a silicon substrate 101. SOI layer 103 is formed at a predetermined region on a main surface of buried oxide film 102. On both a main surface of SOI layer 103 and a predetermined region on the main surface of buried oxide film 102, gate electrode layer 105 is formed. A gate insulating film 106 is formed between SOI layer 103 and gate electrode layer 105. An interlayer insulating film 109 is formed such that it covers gate electrode layer 105.

FIG. 41 is a cross sectional view taken along line 500—500 of FIG. 39. Referring to FIG. 41, buried oxide film 102 is formed such that it contacts substrate 101. SOI layer 103 is formed on buried oxide film 102. A sidewall insulating film 116 is formed at both side ends of SOI layer 103. A silicide layer 108 is formed at a predetermined region on the main surface of SOI layer 103. Formed on gate insulating film 106 are gate electrode 105, and sidewall insulating film 116 positioned at both side ends of gate electrode 105. Silicide layer 108 is formed on a surface of gate electrode 105. Interlayer insulating film 109 is formed such that it covers the transistor. A metal wiring 110 is formed such that it contacts silicide layer 108 formed on the source/drain regions of SOI layer 103.

FIGS. 42–71 illustrate a manufacturing process of the semiconductor shown in FIGS. 39–41. Referring to FIGS. 42–71, a conventional semiconductor manufacturing process will be described. FIG. 42 shows an example in which buried oxide film 102 is formed on silicon substrate 101 and SOI layer 103 is further formed thereon. Silicon substrate 101, buried oxide film 102 and SOI layer 103 constitute an SOI substrate. By oxidizing a surface of SOI layer 103, an oxide film 104 is formed which has a thickness of 100–200 Å.

As shown in FIG. 43, a nitride film 125 is formed on a main surface of oxide layer 104. As shown in FIG. 44, a resist 100 is formed on a predetermined region on a main surface of nitride film 125. As shown in FIG. 45, nitride film 125, oxide film 104 and SOI layer 103 are etched by using resist 100 as a mask. Then, as shown in FIG. 46, resist 100 is removed.

FIG. 47 is a cross-sectional view of the stage shown in FIG. 46, taken along line 600—600. SOI layer 103, oxide film 104 and nitride film 125 are formed on a predetermined region on a main surface of buried oxide film 102.

Then, as shown in FIGS. 48 and 49, SOI layer 103 is oxidized. FIGS. 48 and 49 illustrate the initial stage of the oxidizing process; FIG. 48 showing a cross-sectional view taken along line 500—500 of FIG. 39, and FIG. 49 is a cross-sectional view taken along line 600—600 of FIG. 39. Referring to FIG. 49, oxidizing agent 146 is diffused and reaches SOI layer 103 to oxidize SOI layer 103.

FIGS. 50 and 51 are cross sectional views in which the oxidizing process is completed. FIGS. 50 and 51 are cross sectional views taken along lines 500—500 and 600—600, respectively. Referring to FIG. 51, as the oxidizing process proceeds, lower part of SOI layer 103 is oxidized. The lower part of SOI layer 103 is thereby lifted upward, and SOI layer 103 is curved upward. Furthermore, an upper side end 103b of SOI layer 103 is rounded by the oxidation.

FIGS. 52 and 53 show a state in which nitride film 125 is removed after the oxidizing process is completed. FIGS. 52 and 53 are cross sectional views taken along lines 500—500 and 600—600, respectively.

As shown in FIG. 54, resist 100 is formed on a P-type MOS region. By using resist 100 as a mask, boron ions are implanted into an N-type MOS region. This ion-implantation serves as a channel-implantation of N-type MOSFET.

After resist 100 formed on the P-type MOS region is removed, resist 100 is again formed on the N-type MOS region, as shown in FIG. 55. By using resist 100 as a mask, phosphorus ions are implanted into the P-type MOS region. This ion-implantation serves as a channel-implantation of P-type MOSFET. Resist 100 is then removed.

Then, by removing oxide film 104, a shape as shown in FIG. 56 is obtained. FIG. 57 is a cross sectional view, taken along line 600—600, after oxide film 104 is removed. Referring to FIG. 57, buried oxide film 102 which had existed under a curved portion 103f of SOI layer 103 was removed when oxide film 104 was removed.

As shown in FIGS. 58 and 59, an oxide film 106 is then formed on a surface of SOI layer 103. Oxide film 106 serves as a gate oxide film of the transistor.

As shown in FIG. 60, a polysilicon layer 105 is formed on the entire surface to a thickness of approximately 2000 Å. FIG. 61 is a cross sectional view, taken along line 600—600, of the stage shown in FIG. 60. The polysilicon layer 105 is formed such that it intrudes under the curved portion of SOI layer 103.

Resist 100 is then formed at a predetermined region on polysilicon layer 105, as shown in FIG. 62. Resist 100 is used as a mask and, as shown in FIG. 63, polysilicon layer 105 is selectively removed by etching.

As shown in FIG. 64, resist 100 is formed only on the N-type MOS region and boron ions are implanted into the P-type MOS region. This implantation serves as an LDD implantation of P-type MOSFET. As shown in FIG. 65, resist 100 is formed only on the P-type MOS region and phosphorus ions are implanted into the N-type MOS region. This implantation serves as an LDD implantation of N-type MOSFET.

After resist 100 is removed, an insulating film 116a is formed on the entire surface, as shown in FIG. 66.

By anisotropically etching insulating film 116a, a sidewall insulating film 116 is formed as shown in FIG. 67.

As shown in FIG. 68, resist 100 is formed only on the N-type MOS region and boron ions are implanted into the P-type MOS region. This implantation serves as a source/ drain implantation of the P-type MOSFET. Resist 100 is then removed.

As shown in FIG. 69, resist 100 is again formed only on the P-type MOS region and arsenic ions are implanted into the N-type M0S region. This implantation serves as a source/drain implantation of the N-type MOSFET. Resist 100 is then removed.

A silicide layer 108 is formed on a surface of SOI layer 103 and on a surface of gate electrode 105, as shown in FIG. 70. An interlayer insulating film 109 is then formed to a thickness of approximately 7000 Å. Then, after a contact hole (not shown) is formed for connecting to the source/ drain regions, a metal wiring 110 is formed by forming a metal layer mainly consisting of aluminum using the sputtering method. FIG. 71 is a cross sectional view, taken along line 600—600, of the stage shown in FIG. 70. As can be seen, SOI layer 103 is curved upward at its both ends. Furthermore, gate electrode 106 is formed such that it intrudes under the curved portion of SOI layer 103.

Thus, the conventional semiconductor device shown in FIGS. 39–41 is accomplished.

As described above, according to the conventional semiconductor manufacturing method, an end portion of SOI layer 103 is curved upward by the process of oxidizing SOI layer 103. This process of oxidizing a side wall of SOI layer 103 contemplates oxidizing and absorbing a region damaged by etching that remains in SOI layer 103 side wall when SOI layer 103 is dry-etched. For this reason, the oxidizing process is important. In other words, if the side wall is not oxidized, the region damaged by etching causes increased leakage current, and uniformity of the transistor deteriorates. Furthermore, as oxidation proceeds, lower part of SOI layer 103 is oxidized and SOI layer 103 is thereby lifted upward. Thus, SOI layer 103 is curved upward. The curved SOI layer 103 causes problems described below.

Firstly, as SOI layer 103 is curved, internal stress occurs resulting in crystal defect in SOI layer 103. The crystal defect increases leakage current of the transistor when the transistor is formed thereafter. This is problematic because it deteriorates electrical performance of the transistor.

Secondly, as SOI layer 103 is curved upward, a gate electrode intrudes under a lower part of SOI layer 103 when the gate electrode is formed in the process thereafter. For this reason, threshold voltage of this region is lowered and as a result, a hump is formed in subthreshold characteristic. This adversely affects electrical characteristic of the transistor formed.

SUMMARY OF THE INVENTION

An object of the present invention is to provide a semiconductor device which is affected by a parasitic transistor and has less leakage current between the source and the drain.

Another object of the present invention is to easily manufacture a semiconductor device capable of increasing threshold voltage of a parasitic transistor.

A semiconductor device according to one aspect of the present invention includes a semiconductor layer, a first sidewall insulating film and a gate electrode layer. The semiconductor layer is formed on an insulating layer and is round at its upper side end in its cross section along the direction of channel width. The first sidewall insulating film is formed such that it contacts a side of the semiconductor layer in the cross section along the channel width and is increased in its width toward its lower portion. The gate electrode layer is formed on and along an upper surface of the semiconductor layer and a surface of the sidewall insulating film. Still preferably, the semiconductor may be shaped round at an lower side end in its cross section along the direction of the channel width. Still preferably, the semiconductor layer may have a high impurity concentration region formed at its side positioned under the gate electrode layer in its cross section along the direction of the channel width.

In the present semiconductor device, as the semiconductor layer is not curved, defect caused by stress will not occur in the semiconductor layer. Also, as the first sidewall insulating film is formed on the side of the semiconductor layer, the gate electrode layer will not intrude under a lower surface of the semiconductor layer. Furthermore, if the lower side end of the semiconductor layer is rounded in its cross section along the direction of the channel width, electric field concentration at the lower side of the semiconductor layer will not occur. Furthermore, as the semiconductor layer has the high impurity concentration region formed at its side positioned under the gate electrode layer in its cross section along the direction of the channel width, threshold voltage of a parasitic transistor will be increased.

In the semiconductor device manufacturing method according to another aspect of the present invention, a pad oxide film is formed on an upper surface of the semiconductor layer. A nitride film is formed on the pad oxide film. A first sidewall insulating film is formed on a side of the semiconductor layer such that the width of the first sidewall insulating film is increased toward its lower portion. After the first sidewall insulating film is formed, the semiconductor layer is oxidized by using the nitride film as a mask. Still preferably, the oxidizing process described above may be performed by oxidizing the semiconductor layer at or above 1100° C. Still preferably, the length of the nitride film in the direction in which the gate electrode extends may be made shorter than that of the semiconductor layer in the direction in which the gate electrode extends and after forming a second sidewall insulating film on a side of the nitride film, the semiconductor layer may be oxidized. Still preferably, prior to forming the first sidewall insulating film, impurity may be ion-implanted in the vicinity of the side of the semiconductor layer.

In the present semiconductor device manufacturing method, a first sidewall insulating film is formed on a side of a semiconductor layer and the semiconductor layer is oxidized after the formation of the first sidewall insulating film. As a result, an upper side end of the semiconductor layer is rounded due to the oxidation, while the semiconductor layer is not curved upward since a bottom surface in the vicinity of a lower side end of a semiconductor layer is less susceptible to the oxidation. Furthermore, since the semiconductor layer is oxidized at or above 1100° C., stress occurring at the upper and lower side ends of the semiconductor layer is relaxed. Furthermore, as the length of the nitride film in the direction in which the gate electrode extends is made shorter than that of the semiconductor layer in the direction in which the gate electrode extends and as the semiconductor layer is oxidized after forming a second side wall insulating film on a side of the nitride film, oxidizing agent is easily diffused in the oxidizing process and oxidation of the upper side end of the semiconductor layer is accelerated. Furthermore, as impurity is ion-implanted in the vicinity of the side of the semiconductor layer prior to forming the first sidewall insulating film, threshold voltage of a parasitic transistor formed in the side wall of the semiconductor layer is increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
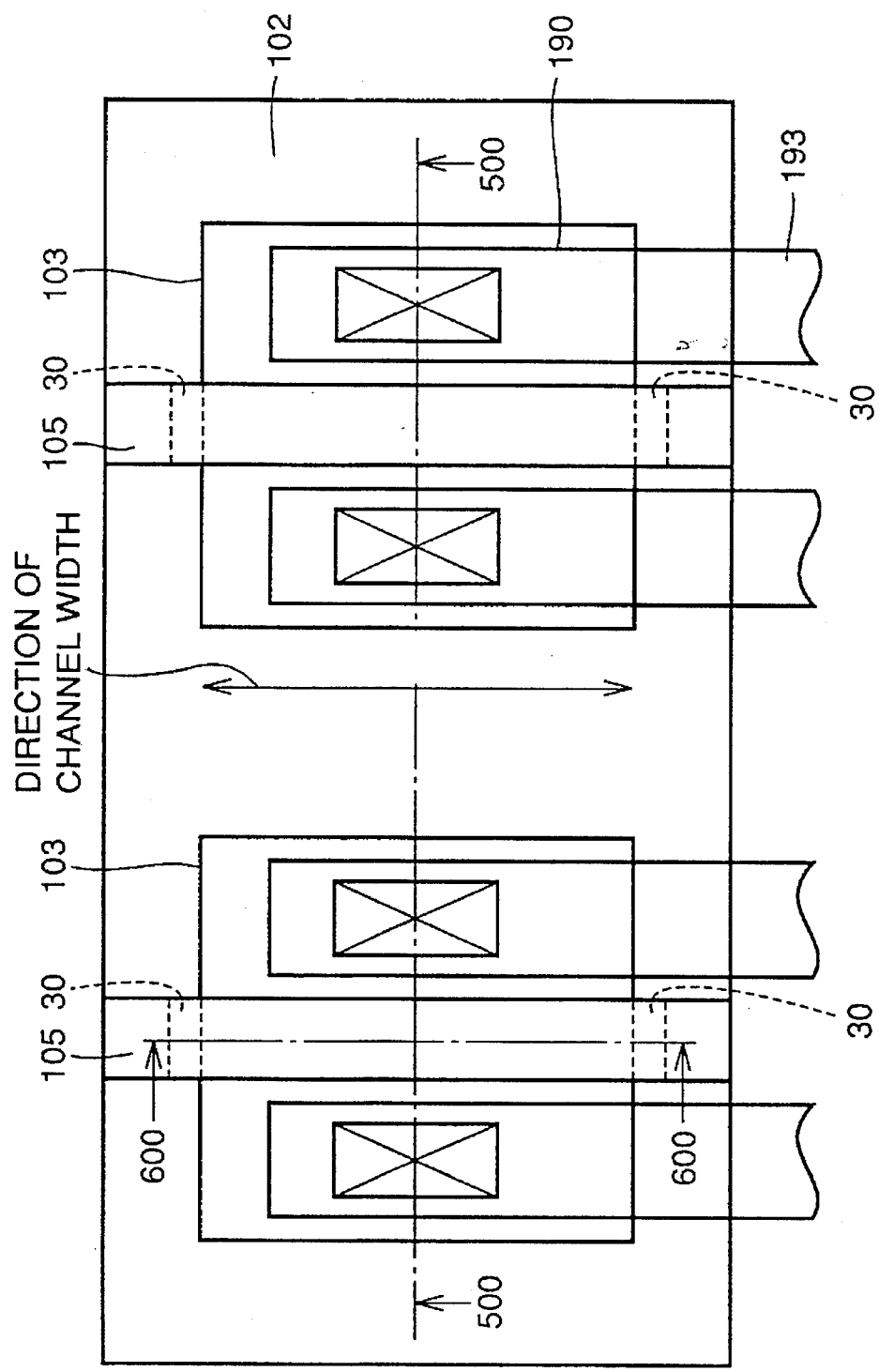
FIG. 1 is a plan view showing a semiconductor device according to a first embodiment of the present invention.

Hereinafter, embodiments of the present invention will be described based on the accompanying drawings. Referring to FIG. 1, in a semiconductor device of a first embodiment, an SOI layer 103 is formed on the predetermined region on a main surface of a buried oxide film 102. A gate electrode layer 105 is formed at a predetermined region on the main surface of buried oxide film 102 and a predetermined region of a main surface of SOI layer 103. A sidewall insulating film 30 is also formed on a side wall portion of the SOI layer which is positioned under a lower surface of gate electrode layer 105. A contact hole 190 is formed on the source/drain regions of SOI layer 103. Furthermore, metal wiring 193 is formed such that it is connected to the source/drain regions within contact hole 190.

Figure 2:
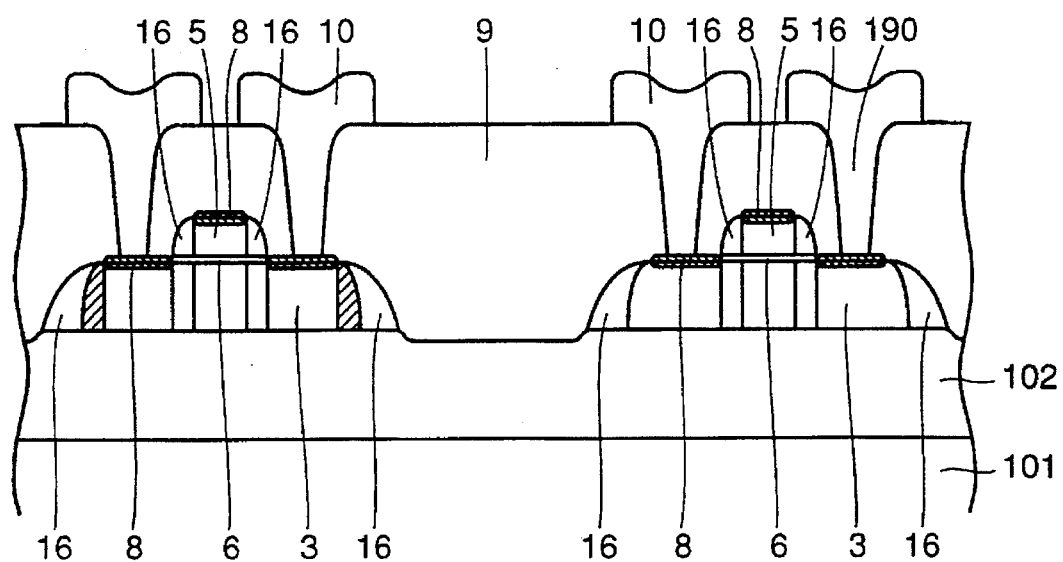
FIGS. 2 and 3 are cross sectional views of the semiconductor device according to the first embodiment shown in FIG. 1, taken along the lines 500—500 and 600—600, respectively.

Referring now to FIG. 2, buried oxide film 102 is formed on a main surface of a silicon substrate 101. SOI layer 3 is formed on the predetermined region of the main surface of buried oxide film 102. At both side walls of SOI layer 3, a sidewall insulating film 16 is formed. A gate insulating film 6 is formed on a predetermined region on the main surface of SOI layer 3. A gate electrode 5 is formed on gate insulating film 6. Sidewall insulating film 16 is formed such that it contacts both sides of gate electrode 5. A silicide layer 8 is formed on a predetermined region on the main surface of SOI layer 3 and on an upper surface of gate electrode 5. An interlayer insulating film 9 is formed such that it covers the entire surface of the transistor region. A metal wiring layer 10 is formed on interlayer insulating film 9 and is connected to silicide layer 8 via contact hole 190.

Figure 3:
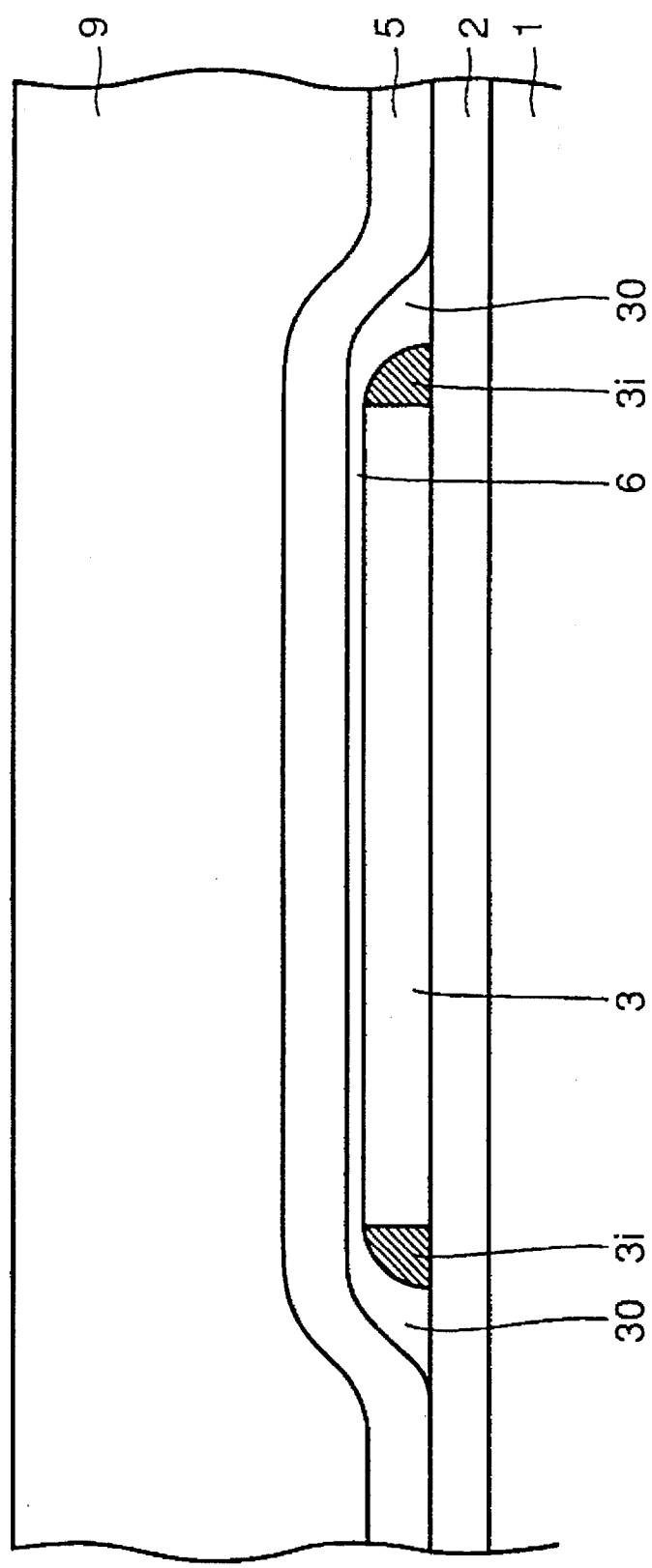

Referring now to FIG. 3, a buried oxide film 2 is formed on a main surface of a silicon substrate 1. SOI layer 3 is formed on the predetermined region on the main surface of buried oxide film 2. Gate insulating film 6 is formed on the upper surface of SOI layer 3. Sidewall insulating film 30 is further formed such that it contacts both sides of SOI layer 3. Gate electrode 5 is formed on a surface of buried oxide film 2, a surface of sidewall insulating film 30 and an upper surface of gate insulating film 6. Interlayer insulating film 9 is formed on gate electrode 5.

Figure 39:
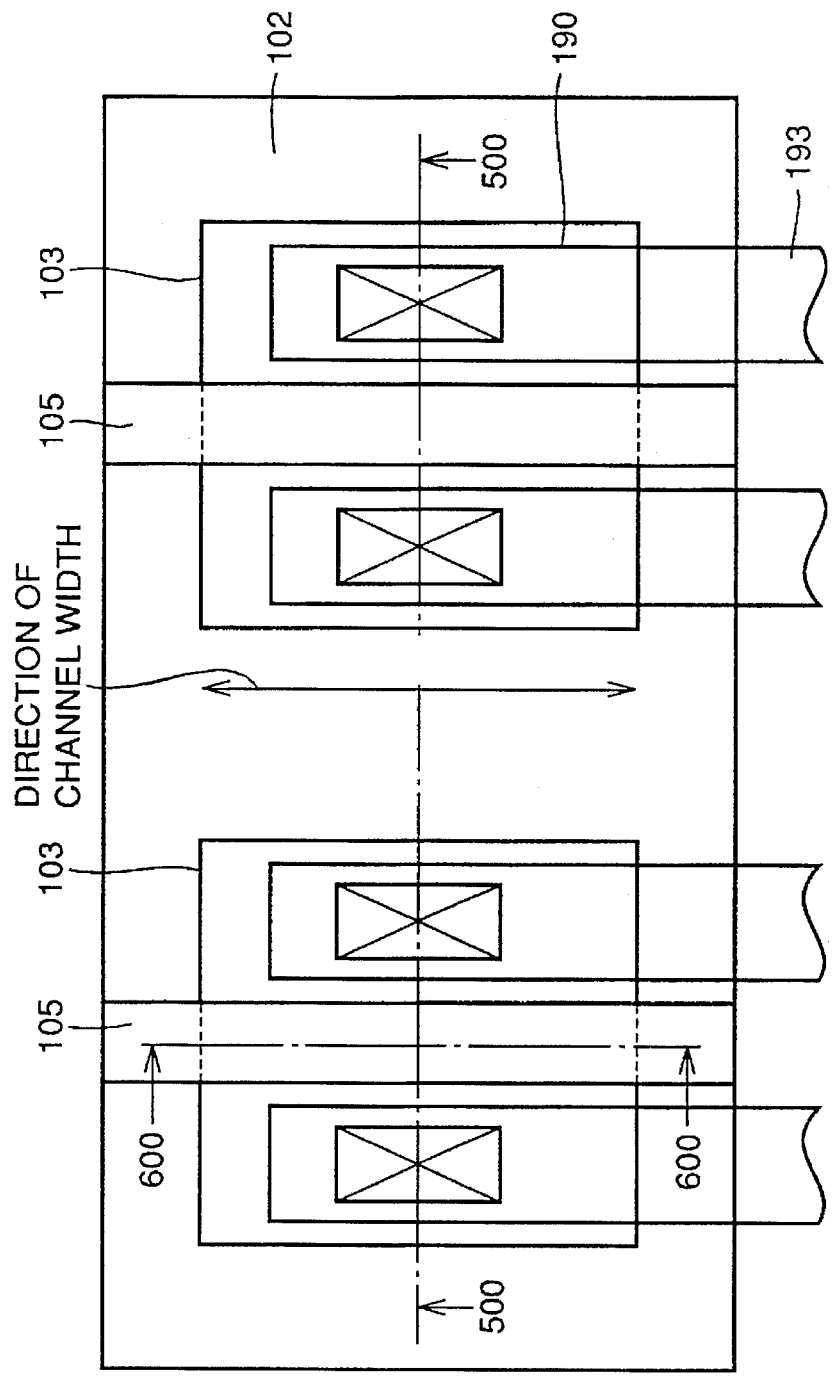
FIG. 39 is a plan view of a conventional semiconductor device.
Figure 40:
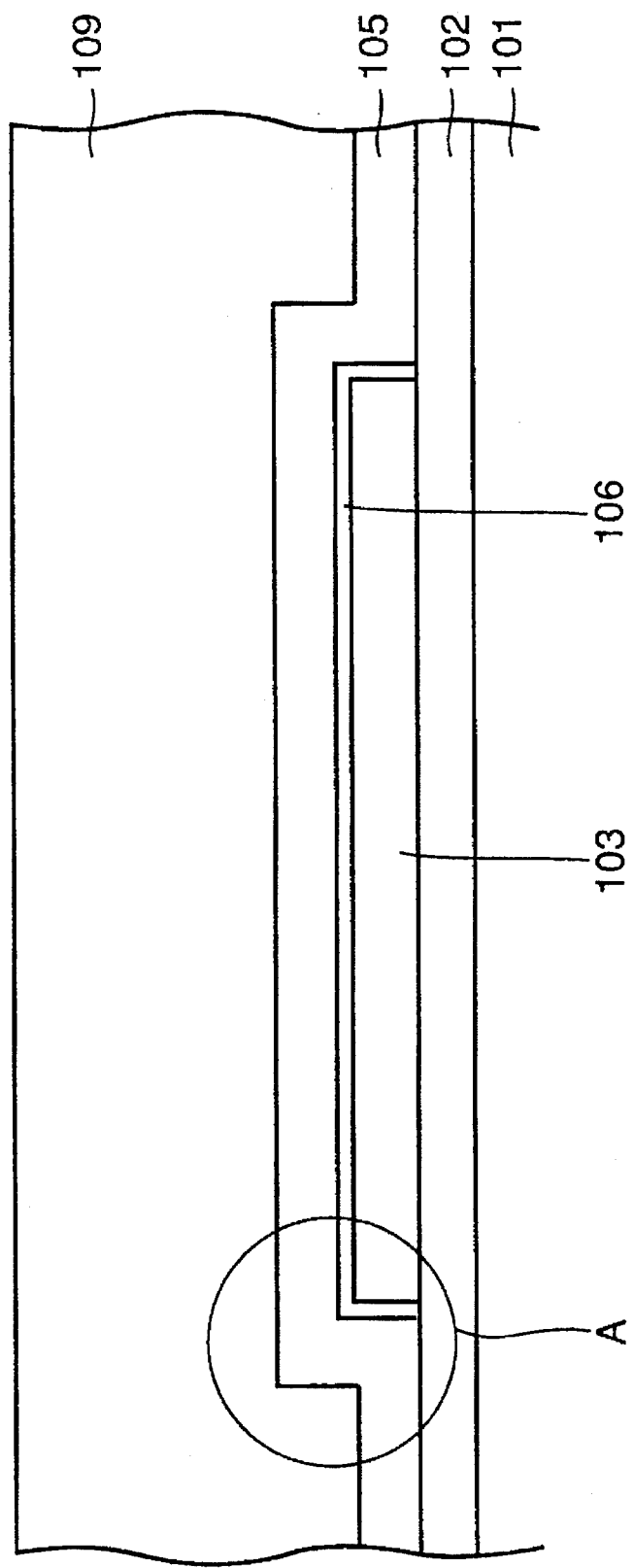
FIGS. 40 and 41 are cross sectional views of the conventional semiconductor device shown in FIG. 39, taken along lines 600—600 and 500—500, respectively.
Figure 41:
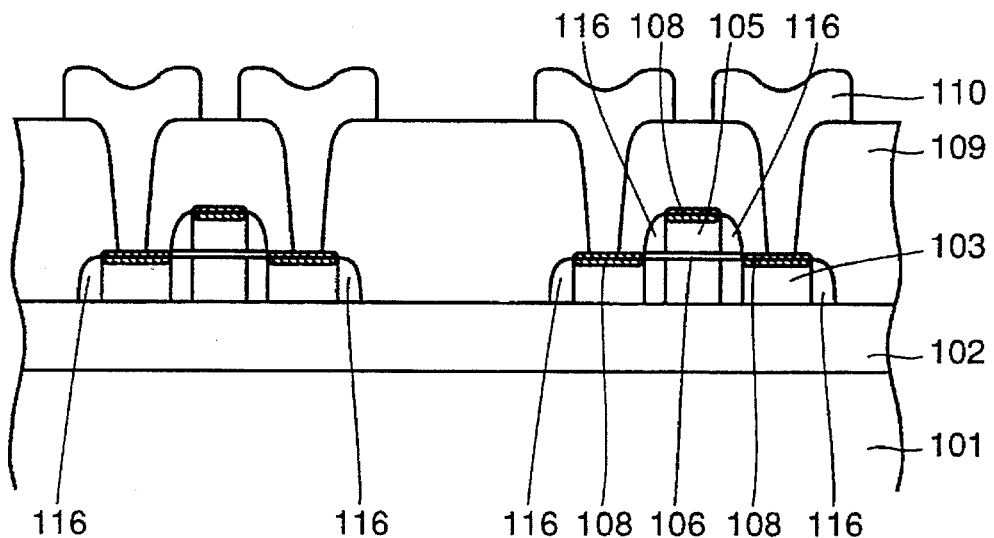
Figure 42:
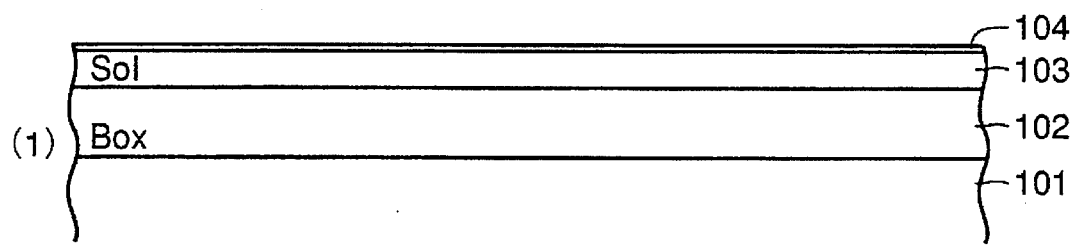
FIGS. 42, 43, 44 and 45 are cross sectional views illustrating the first, second, third and fourth steps of the conventional semiconductor device manufacturing process, respectively.
Figure 43:
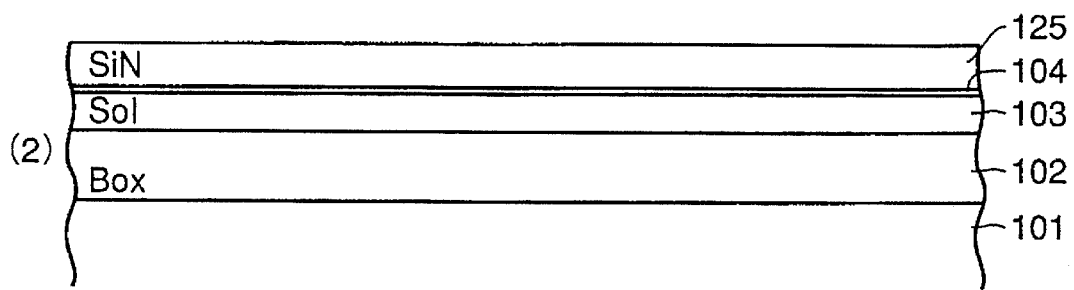

In the first embodiment, SOI layer 3 is not curved at its both ends, as differs from that of the conventional semiconductor device shown in FIGS. 39–41. Therefore, a defect will not occur which would otherwise occur due to stress caused at the curved portion of SOI layer 3. Accordingly, this can prevent generation of leakage current caused by crystal defect. Furthermore, as SOI layer 3 is not curved upward, gate electrode 5 does not intrude under a lower surface of SOI layer 3. Therefore, electric field concentration caused by gate electrode 5 intruding under the lower surface of SOI layer 3, which has been conventionally a problem, will not occur, thereby preventing degradation of subthreshold voltage. Furthermore, as high impurity concentration region 3i is formed at both ends of SOI layer 3, threshold voltage of a parasitic transistor formed in a side wall of SOI layer 3 can be increased.

Figure 4:
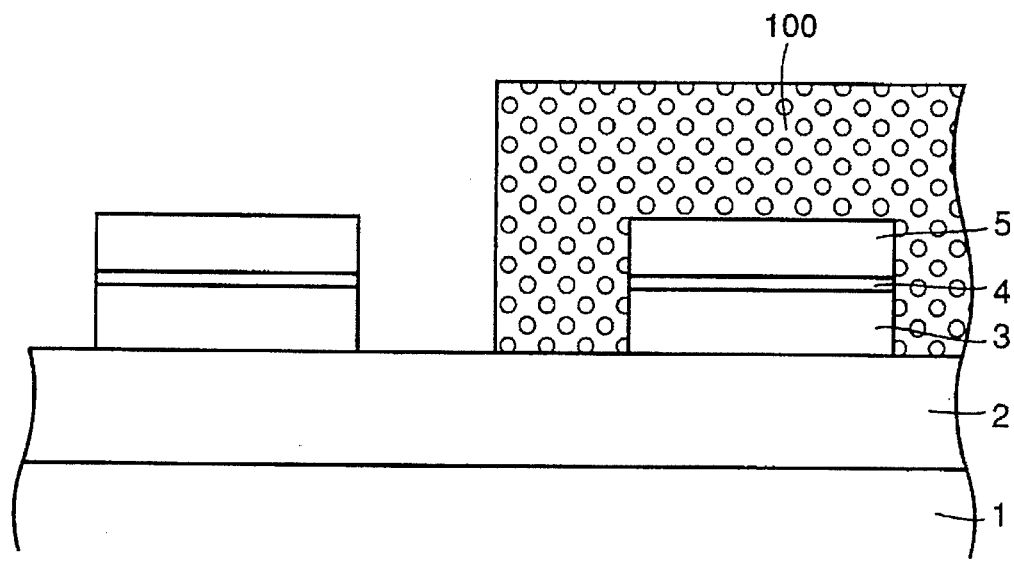
FIGS. 4, 5 and 6 are cross sectional views illustrating the first, second and third steps of a first manufacturing process for the semiconductor device of the first embodiment, respectively.
Figure 47:
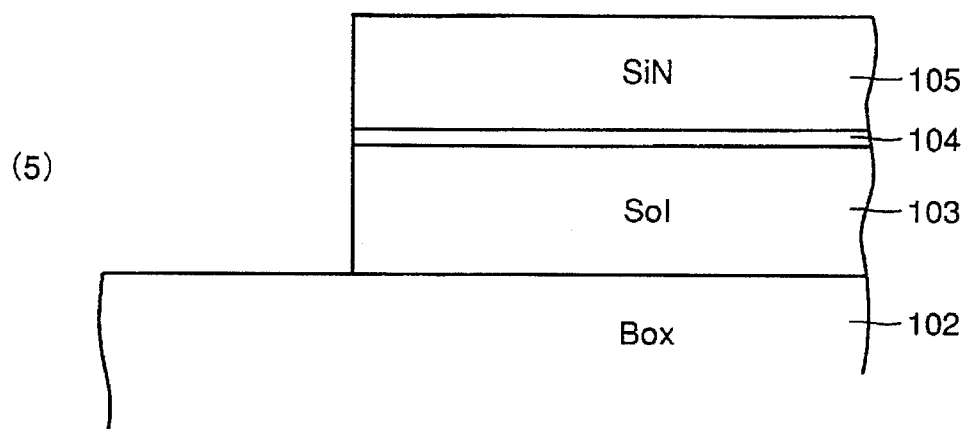
Figure 48:
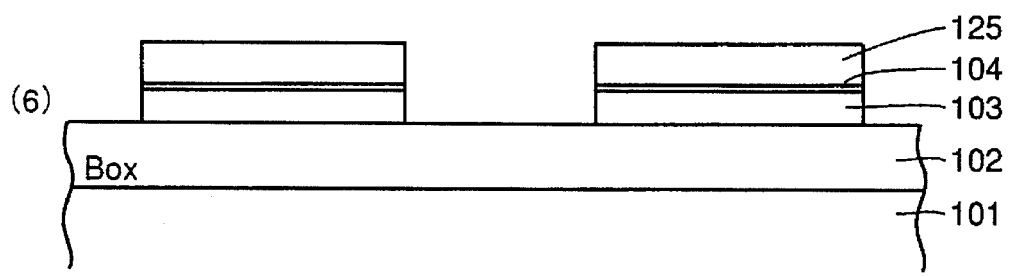
Figure 49:
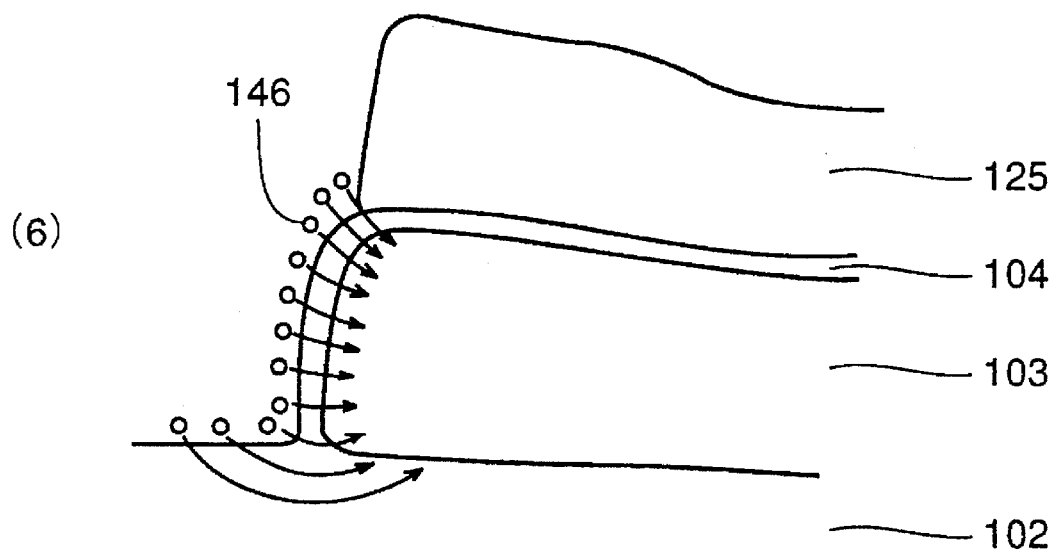
Figure 50:
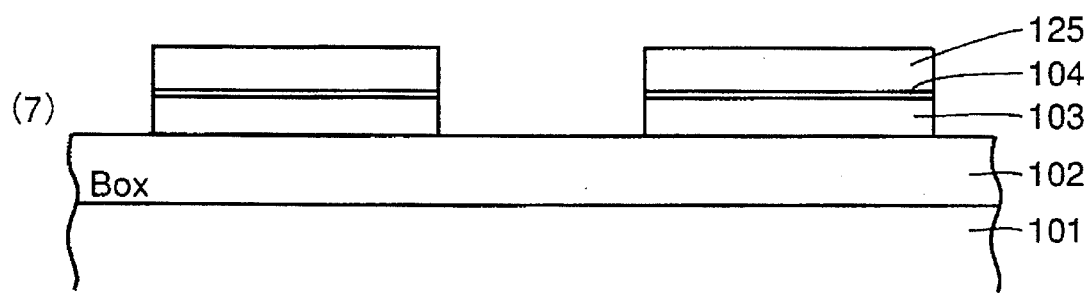

Referring to FIGS. 4–20, a first manufacturing process of the semiconductor device of the first embodiment will be now described. FIG. 4 illustrates the step following that shown in FIG. 47 in the semiconductor device manufacturing process according to the conventional art. As shown in FIG. 4, a resist 100 is formed only on a P-type MOS region.

Figure 5:
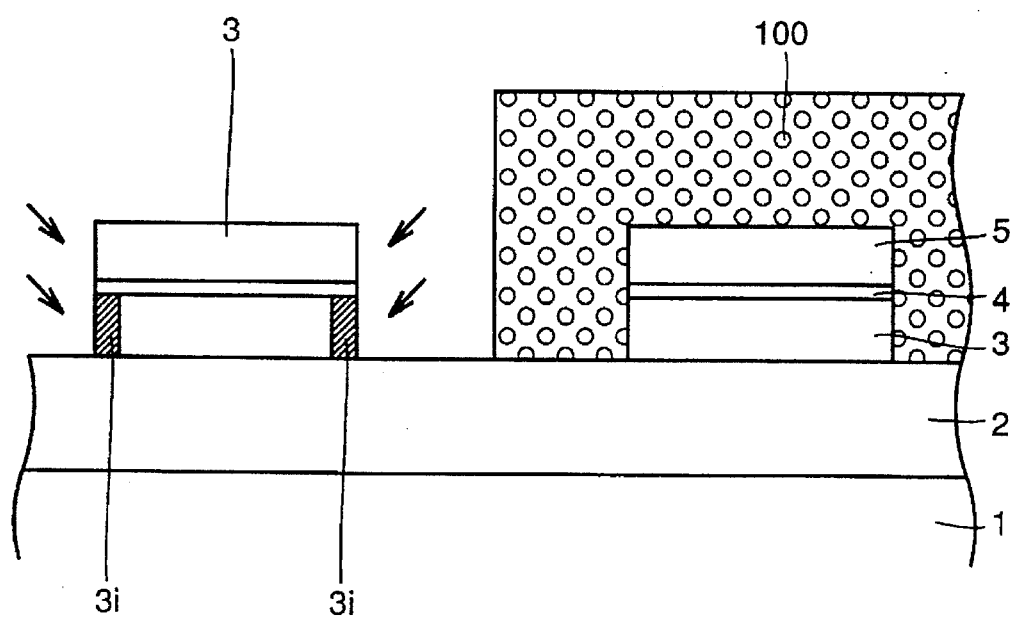
Figure 6:
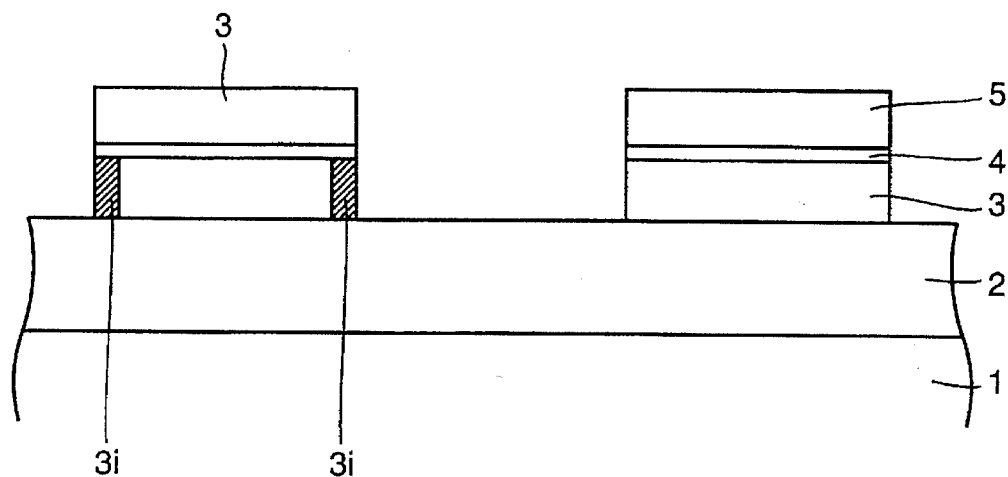
Figure 7:
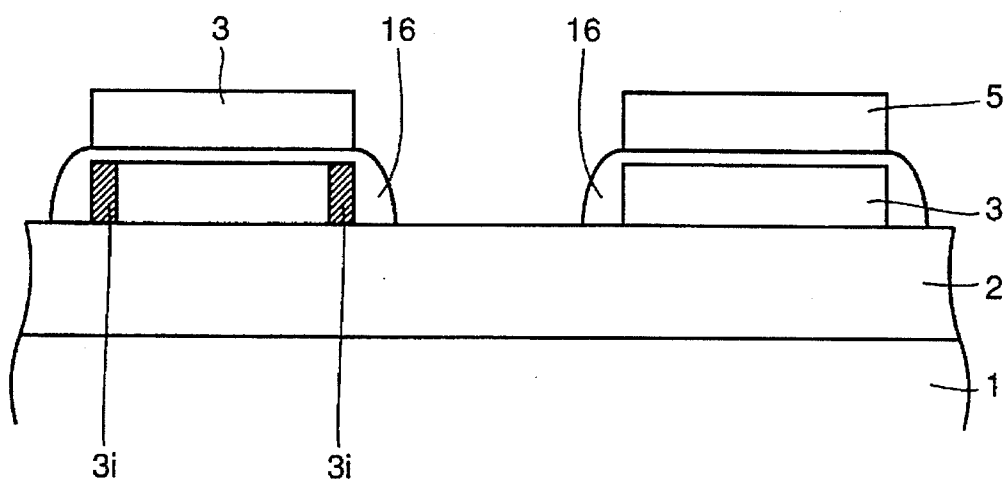
FIGS. 7 and 8, 9 and 10, 11 and 12, 13 and 14, 15 and 16, 17 and 18, and 19 and 20 are cross sectional views illustrating the fourth, fifth, sixth, seventh, eighth, ninth and tenth steps of the first manufacturing process of the semiconductor device of the first embodiment, respectively, the even-numbered figures taken along line 600—600.
Figure 8:
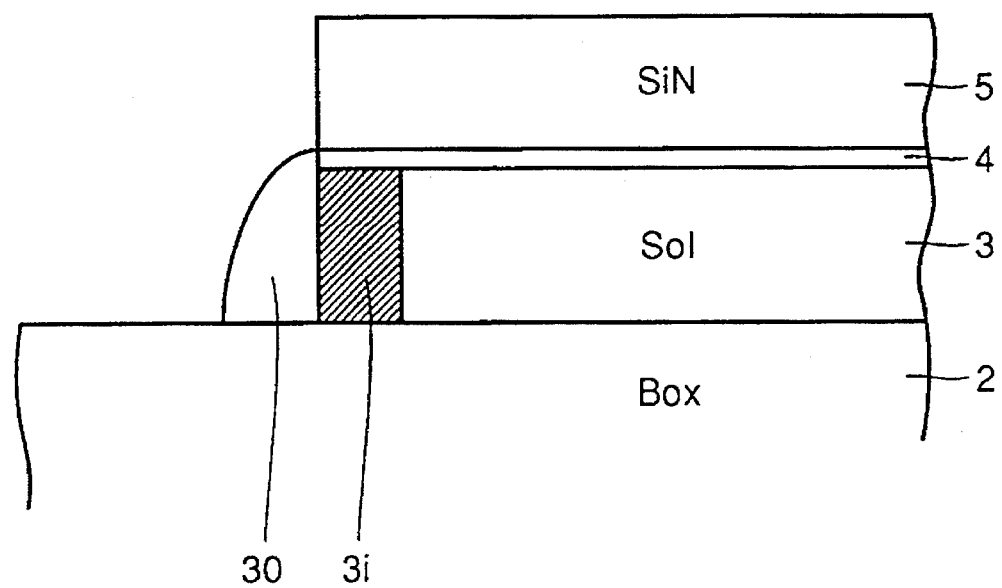

As shown in FIG. 5, resist 100 is used as a mask and boron ions are implanted into an N-type MOS region at an angle of 45°. This implantation serves as a channel implantation of an isolation region. This implantation forms a high impurity concentration region 3i in the side wall of SOI layer 3 and increases threshold voltage of the parasitic transistor positioned in the side wall of SOI layer 3. Then, by removing resist 100, such shape is obtained as shown in FIG. 6. As shown in FIG. 7, a sidewall insulating film 16 is formed on a side wall of SOI layer 3. FIG. 8 shows a cross section of FIG. 7, taken along line 600—600. As shown in FIG. 8, also in a cross section taken along line 600—600, a sidewall insulating film 30 is formed on a side wall of SOI layer 3.

Figure 9:
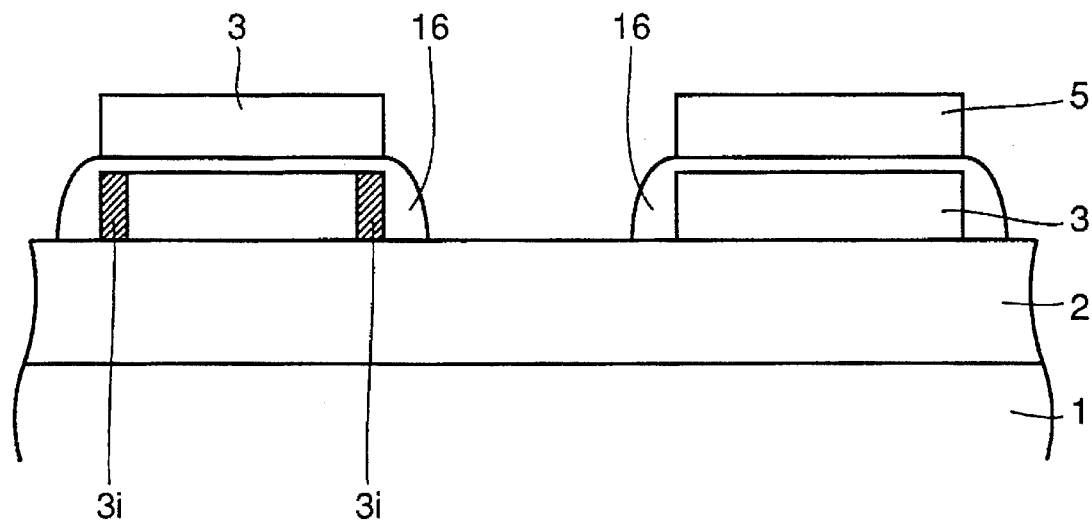
Figure 10:
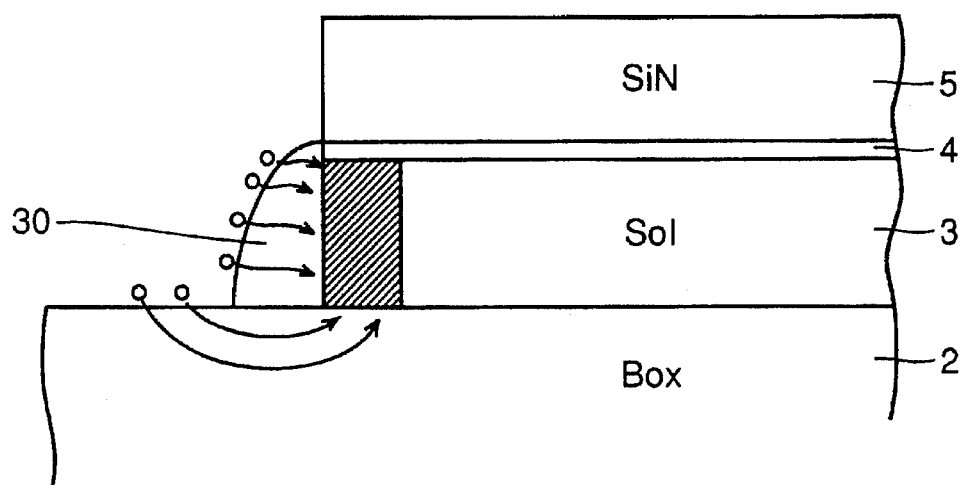

The side wall of SOI layer 3 is oxidized as shown in FIGS. 9 and 10. FIGS. 9 and 10 are cross sectional views taken along lines 500—500 and 600—600, respectively. The oxidizing process is performed at a temperature of 950°–1300° C. Preferably, the temperature for the oxidation is at or above 1100° C. This is because reaction with higher temperature relaxes stress further in the vicinity of the upper and lower portions of SOI layer 3 side wall. With this oxidation, the side wall of SOI layer 3 is oxidized. During this oxidation, as shown in FIG. 10, the upper side wall of SOI layer 3 is easily oxidized while the lower side wall of SOI layer 3 is hard to oxidize due to sidewall 30 formed on SOI layer 3 side wall. This is apparently because oxidizing agent is prevented from diffusing in the lower portion during the oxidizing process, as sidewall insulating layer 30 is thicker in width toward the lower portion. Thus, the upper end of SOI layer 3 side wall is further oxidized and is rounded. On the other hand, since SOI layer 3 is difficult to oxidize in the vicinity of its lower side wall, the conventional problem that the upper portion of the SOI layer is curved due to oxidation is prevented.

Figure 11:
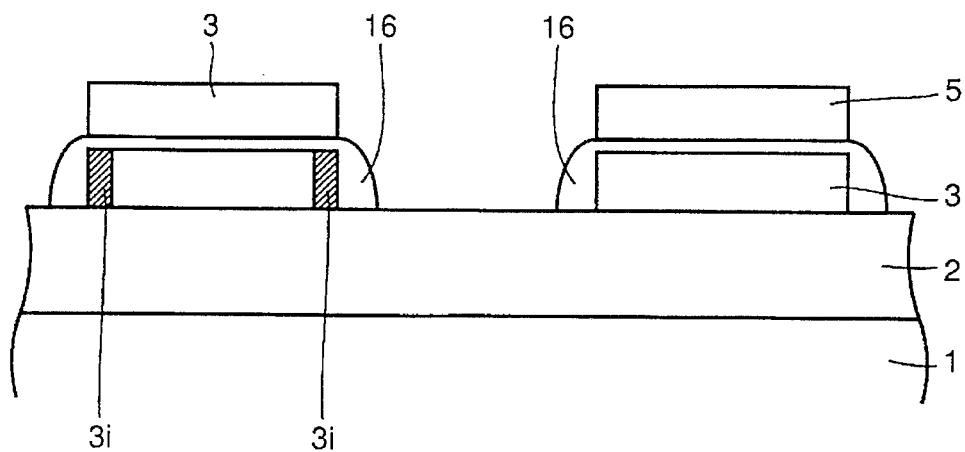
Figure 12:
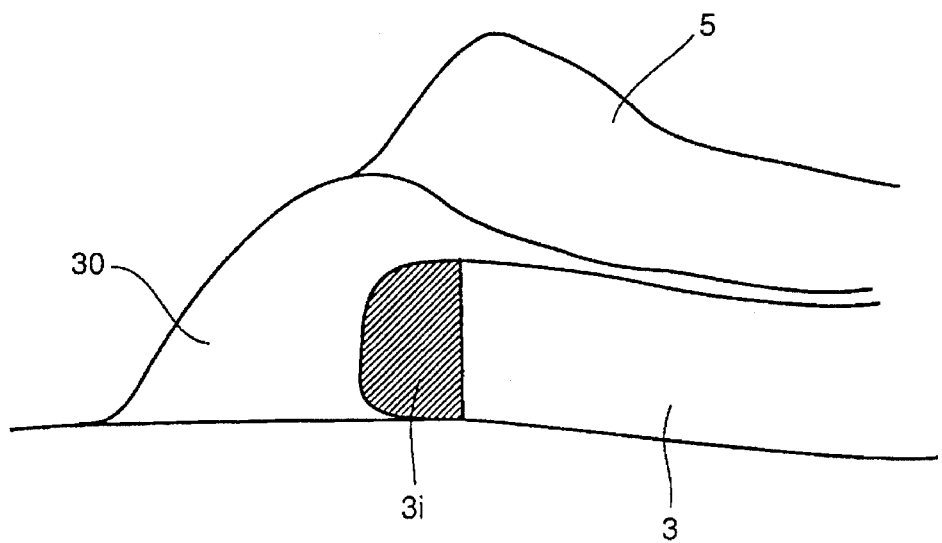
Figure 13:
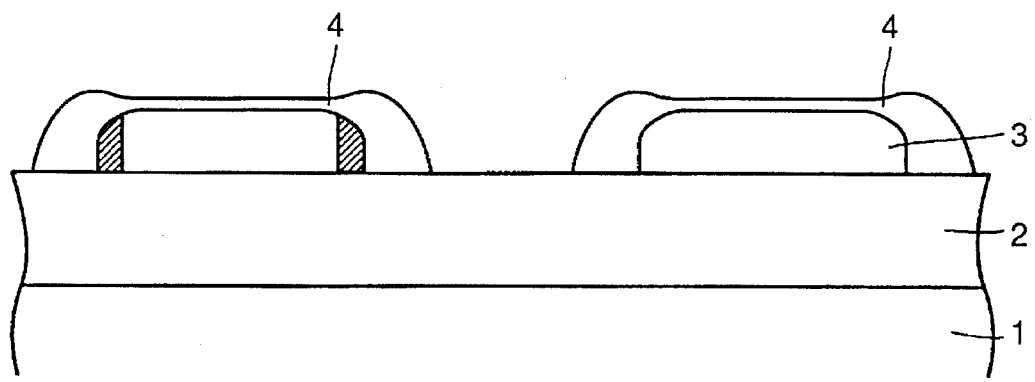
Figure 14:
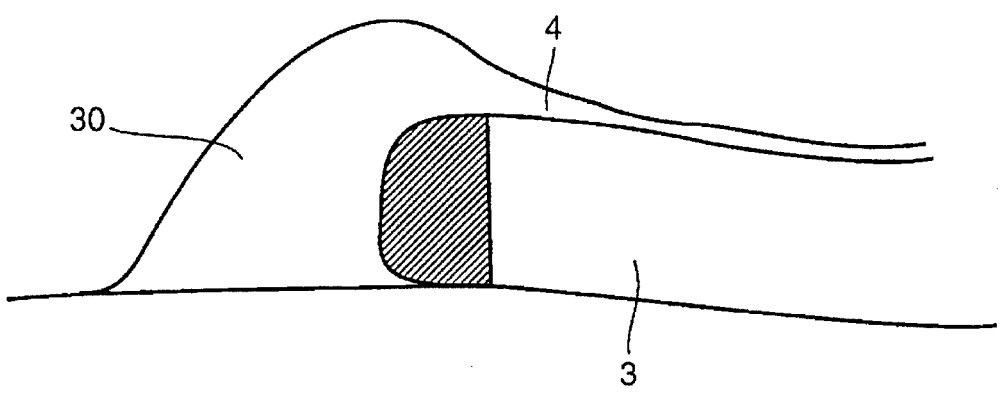
Figure 51:
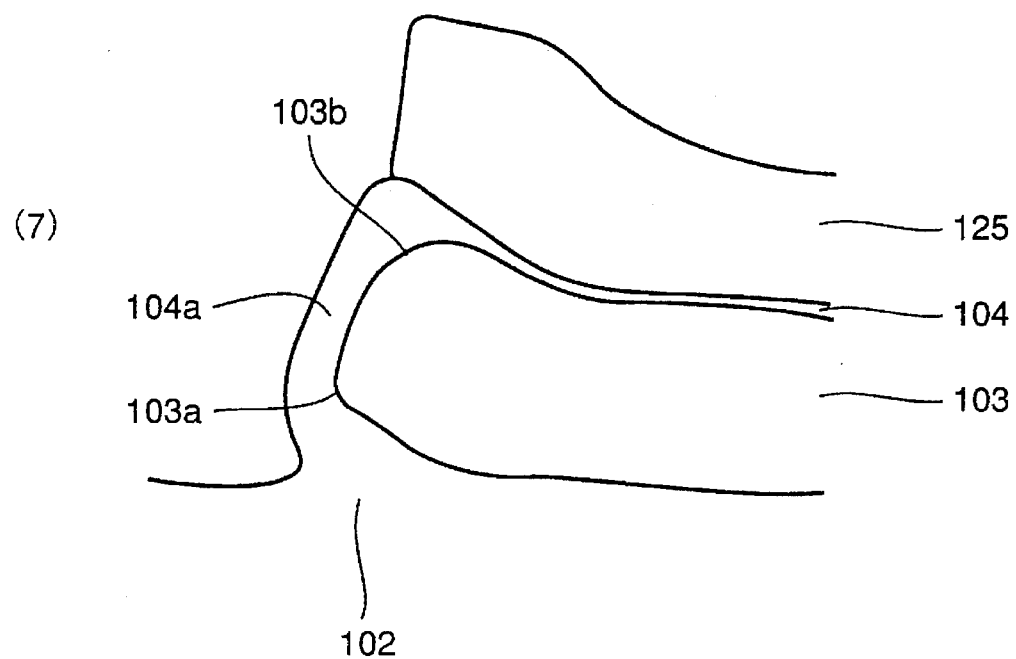
Figure 52:
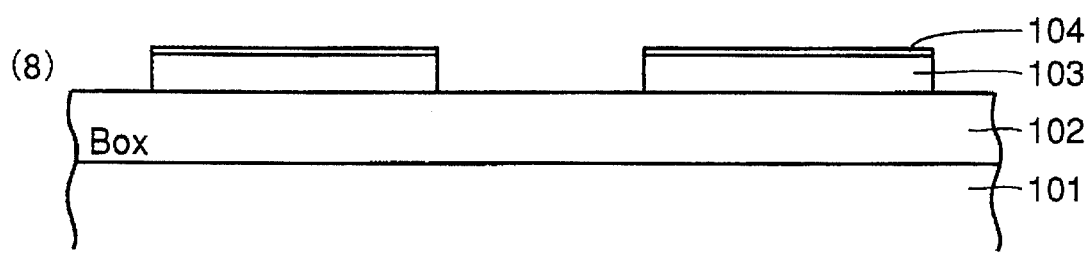
Figure 53:
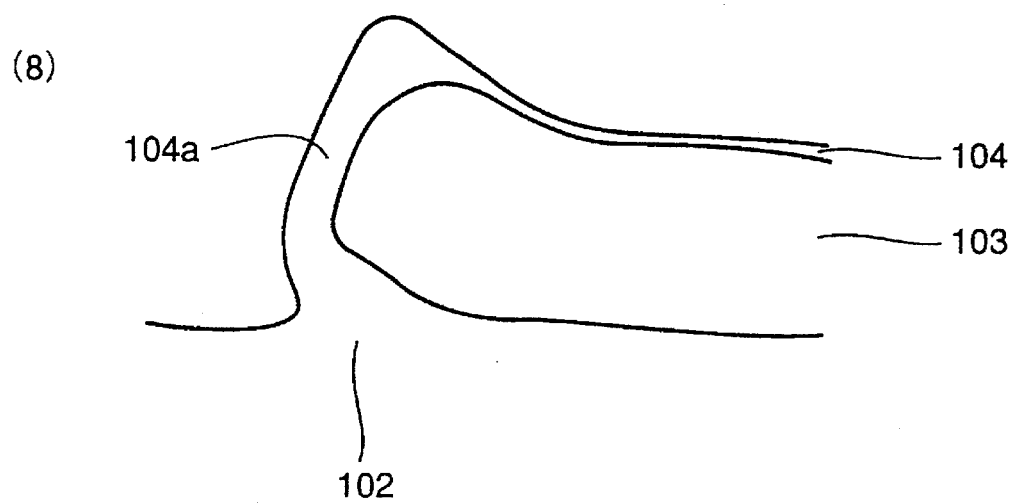
Figure 54:
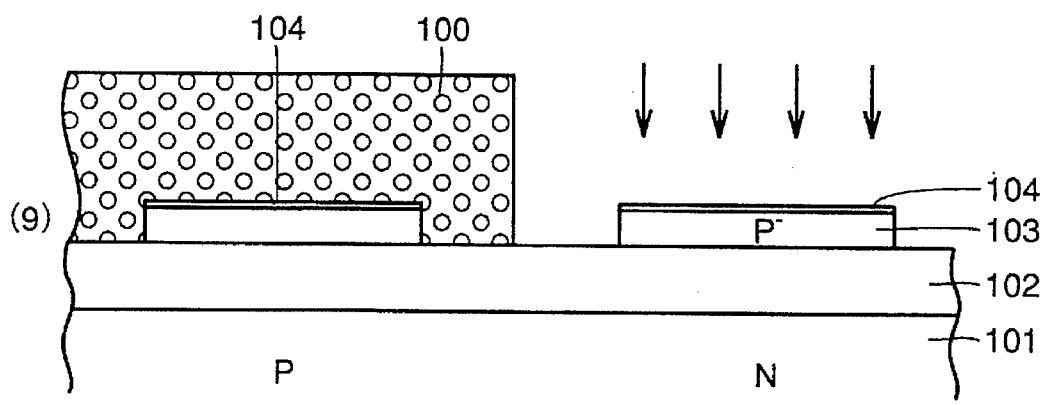
FIGS. 54 and 55 are cross sectional views illustrating the ninth and tenth steps of the conventional semiconductor device manufacturing process, respectively.
Figure 55:
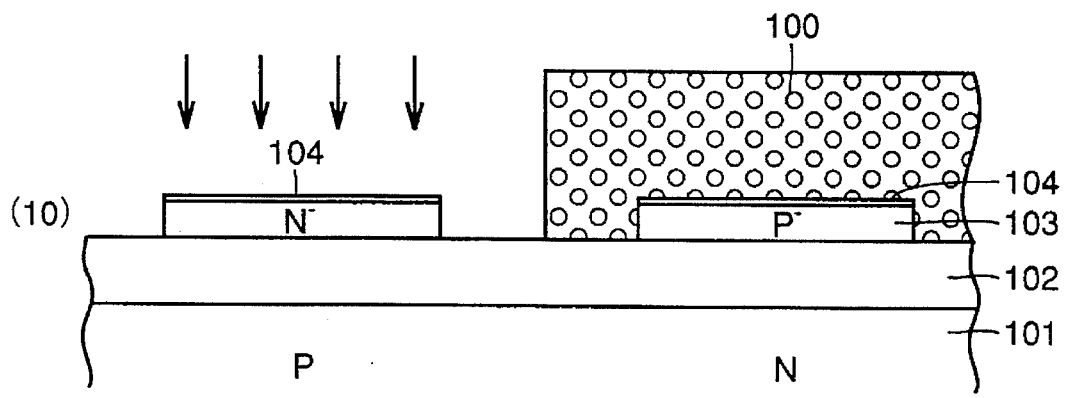
Figure 56:
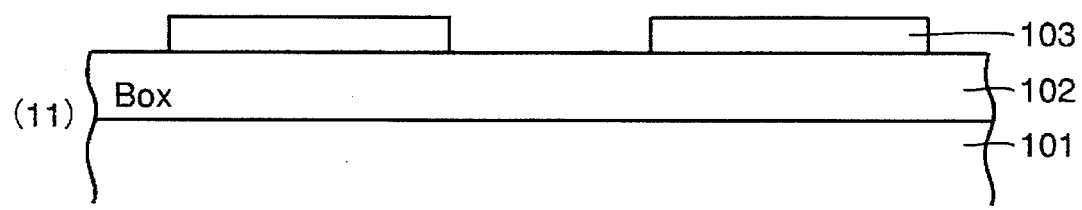
FIGS. 56 and 57, 58 and 59, and 60 and 61 are cross sectional views illustrating the eleventh, twelfth and thirteenth steps of the conventional semiconductor device manufacturing process, respectively, the odd-numbered figures taken along line 600—600.
Figure 57:
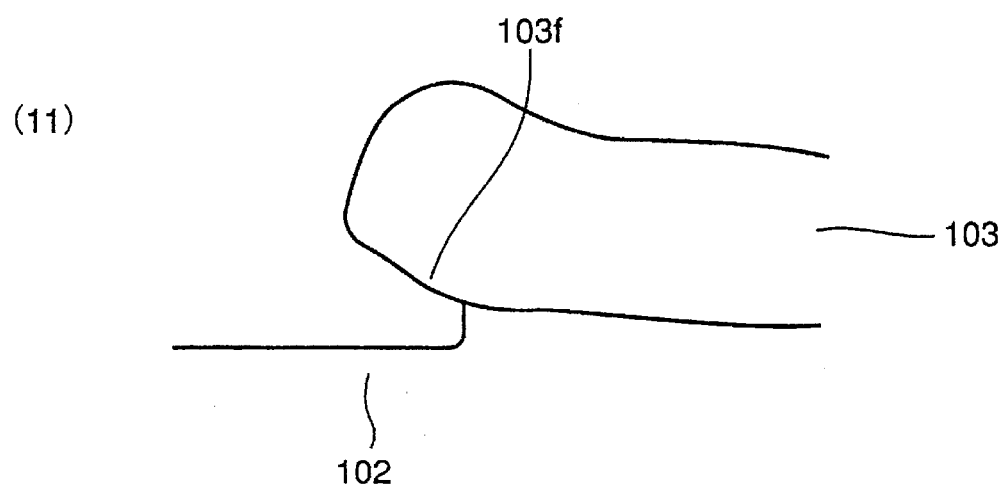
Figure 58:
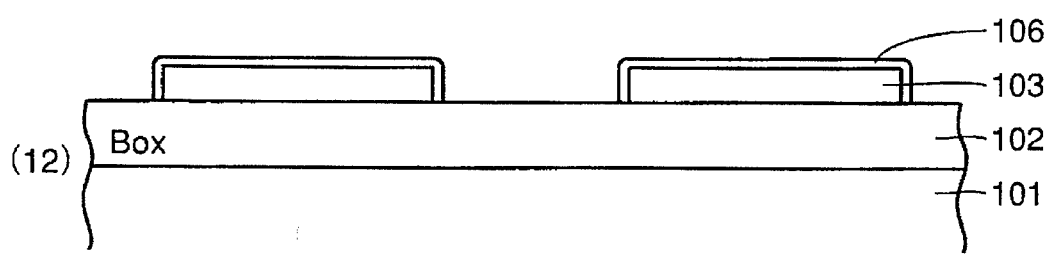
Figure 59:
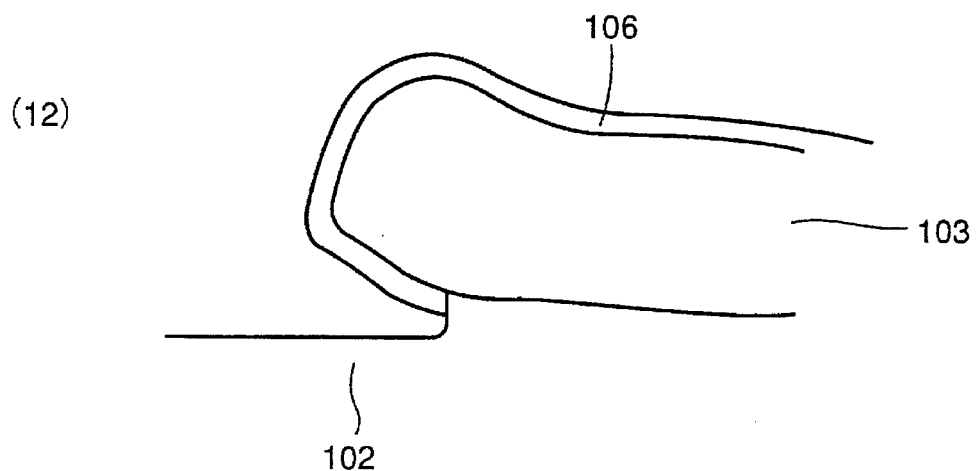
Figure 60:
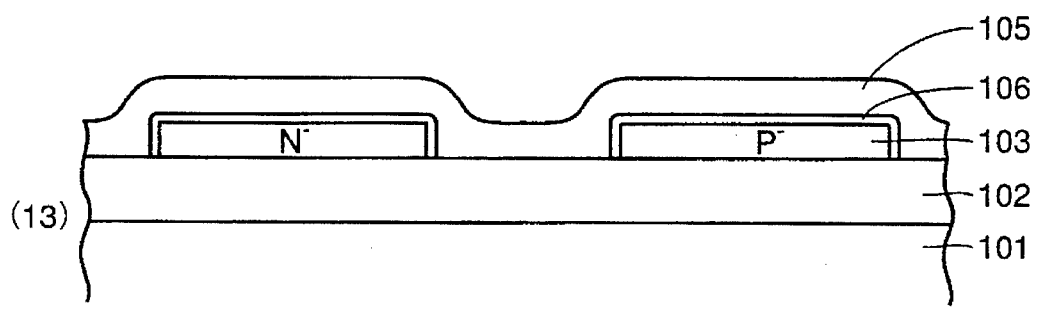
Figure 61:
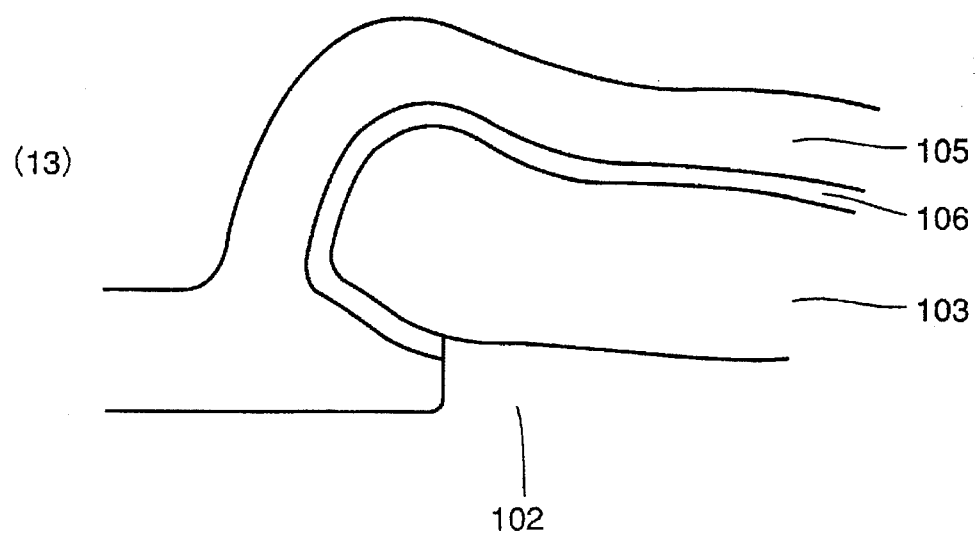
Figure 62:
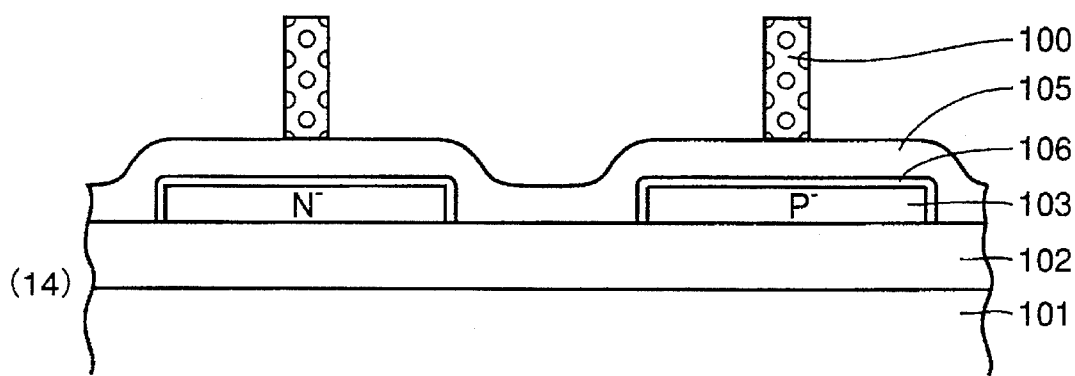
FIGS. 62, 63, 64, 65, 66, 67, 68 and 69 are cross sectional views illustrating the fourteenth, fifteenth, sixteenth, seventeenth, eighteenth, nineteenth, twentieth and twenty-first steps of the conventional semiconductor device manufacturing process, respectively.
Figure 63:
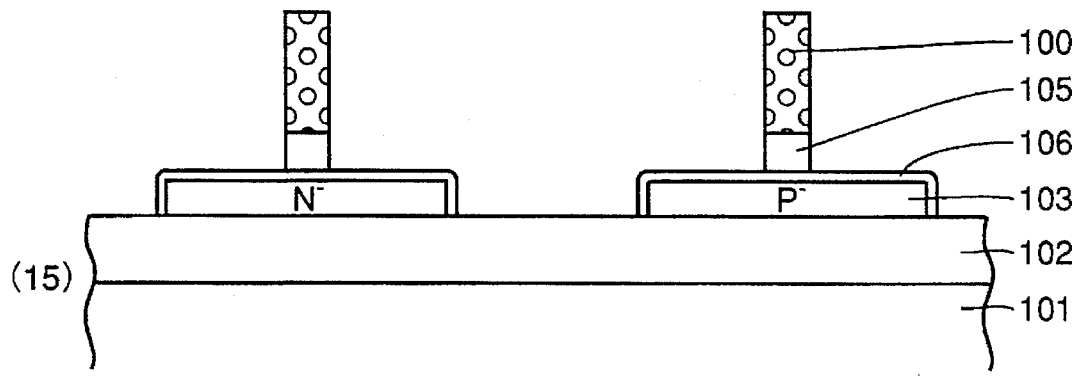
Figure 64:
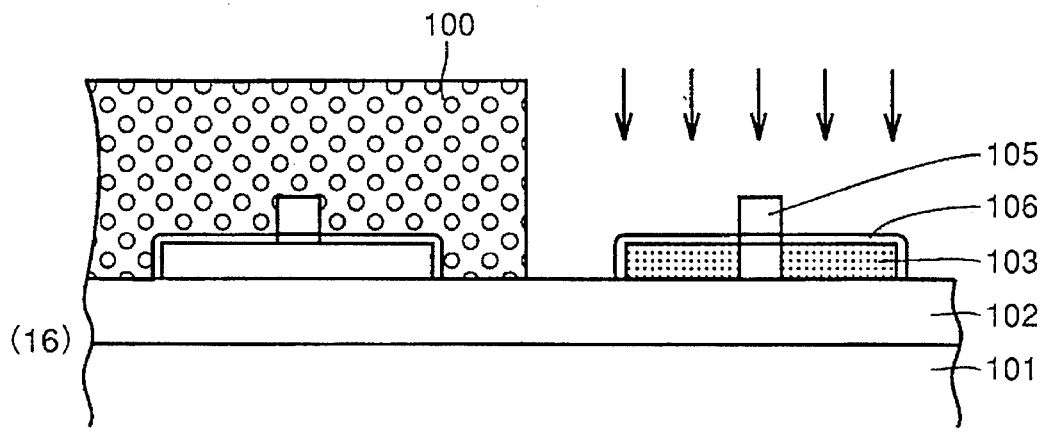
Figure 65:
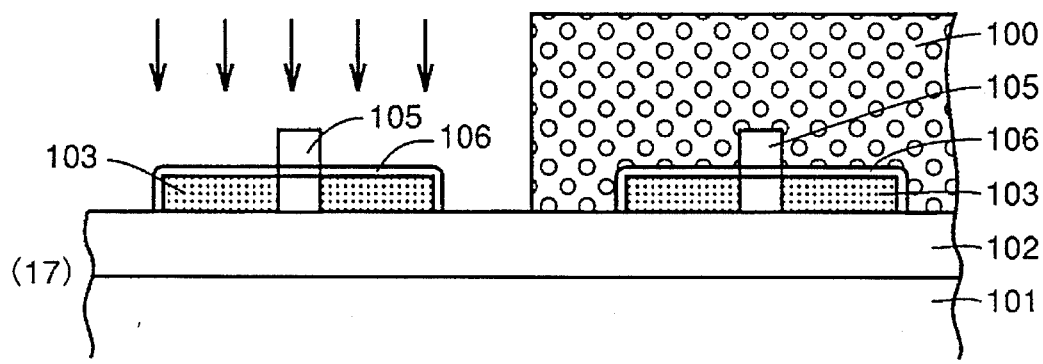
Figure 66:
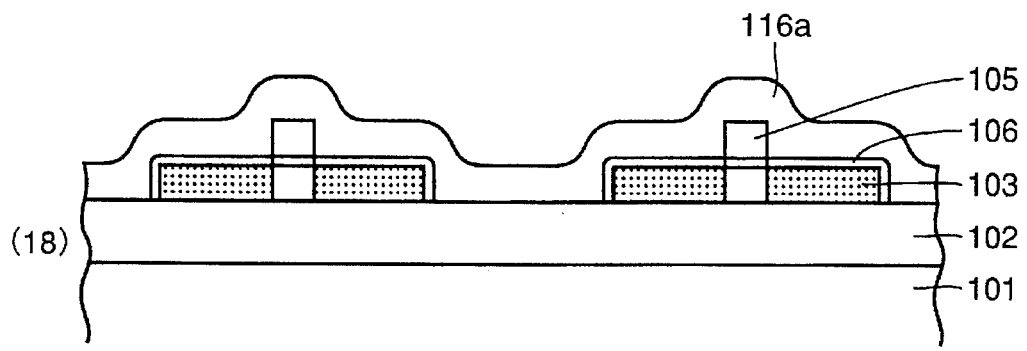
Figure 67:
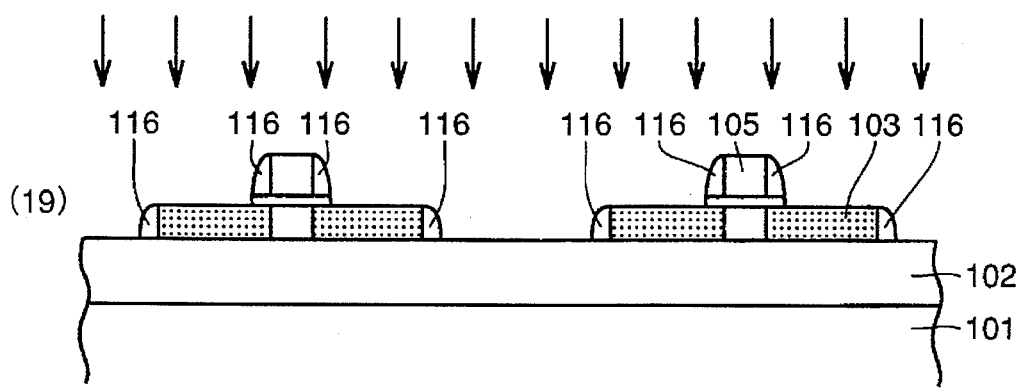
Figure 68:
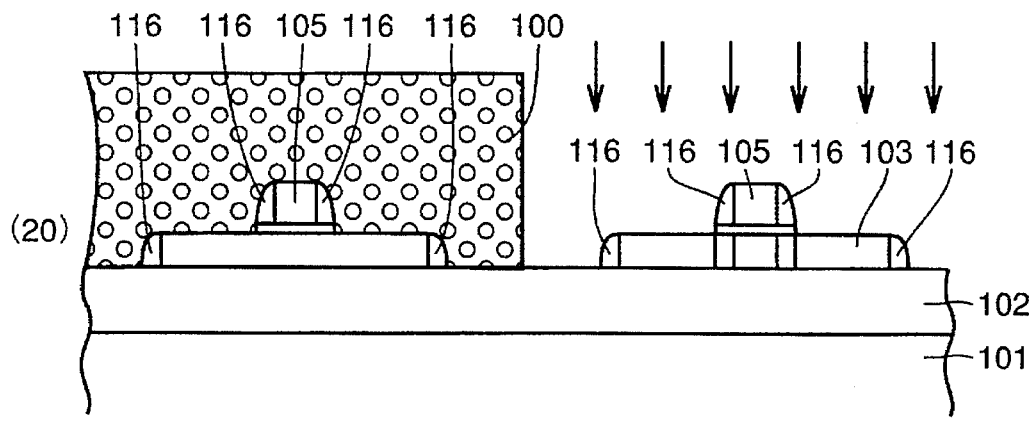
Figure 69:
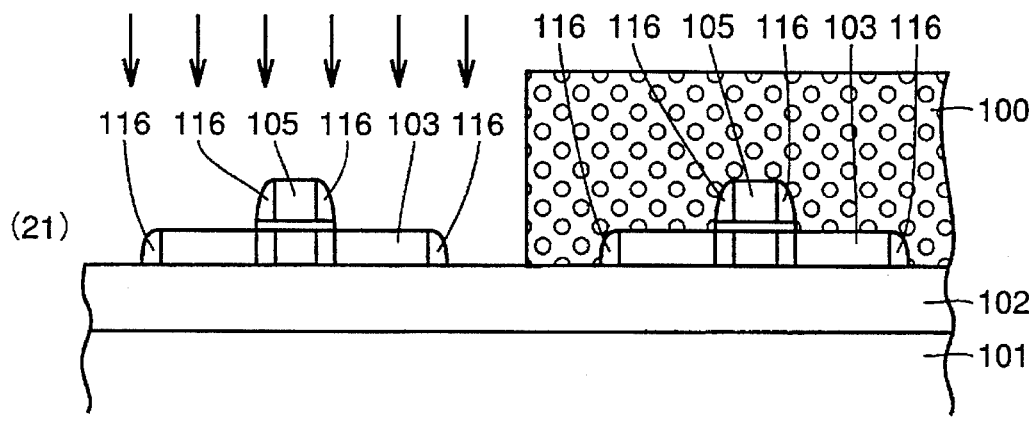
Figure 70:
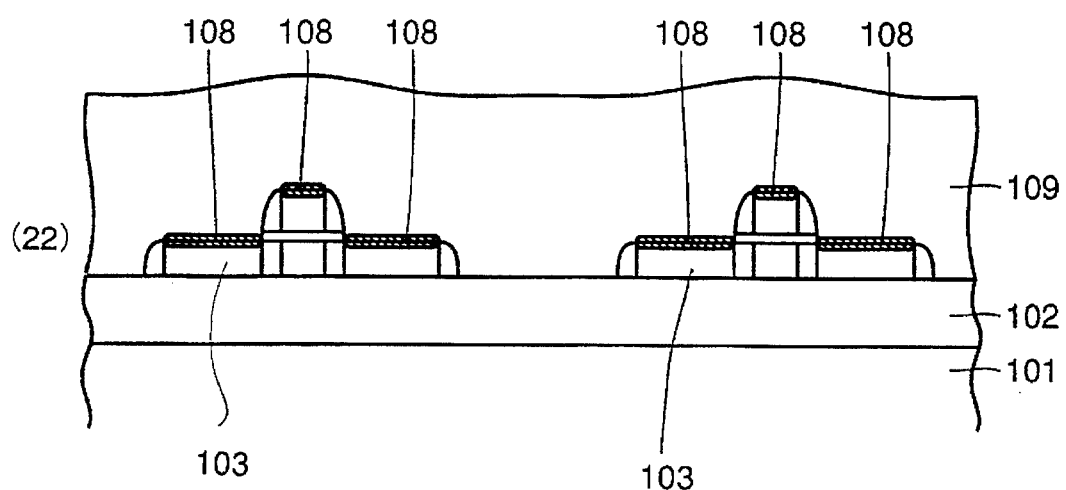
FIGS. 70 and 71 are cross sectional views illustrating the twenty-second step of the conventional semiconductor device manufacturing process, the latter taken along line 600—600.
Figure 71:
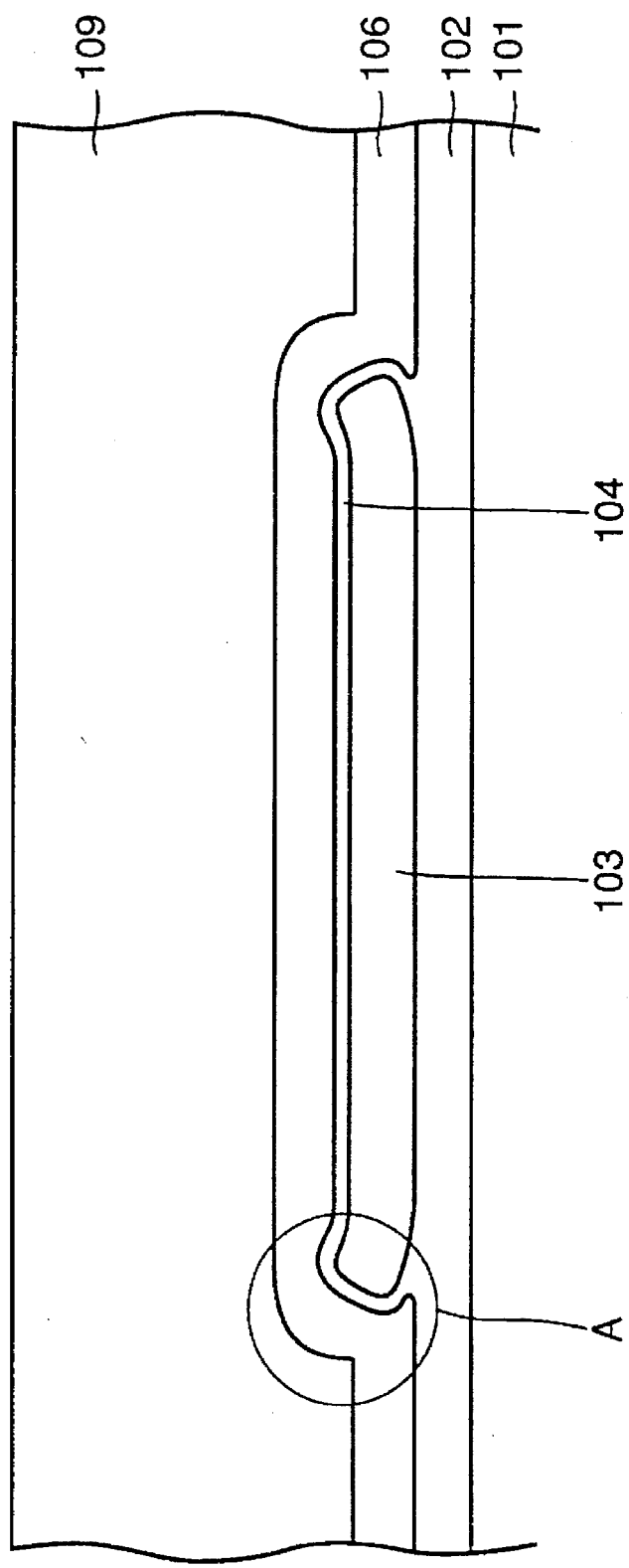

FIGS. 11 and 12 are cross sectional views in which the oxidation reaction is completed. FIGS. 11 and 12 are cross sectional views taken along lines 500—500 and 600—600, respectively. Referring to FIG. 12, it can be seen that SOI layer 3 is not curved upward, when compared with the shape of FIG. 51, that is, the shape obtained by a conventional semiconductor device manufacturing method. Nitride film 5 is then removed using hot phosphoric acid and such shapes as shown in FIGS. 13 and 14 are obtained.

Figure 15:
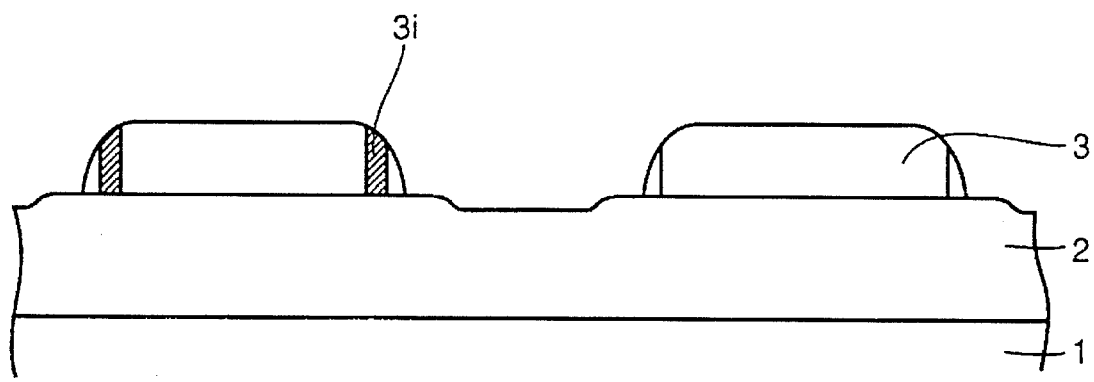
Figure 16:
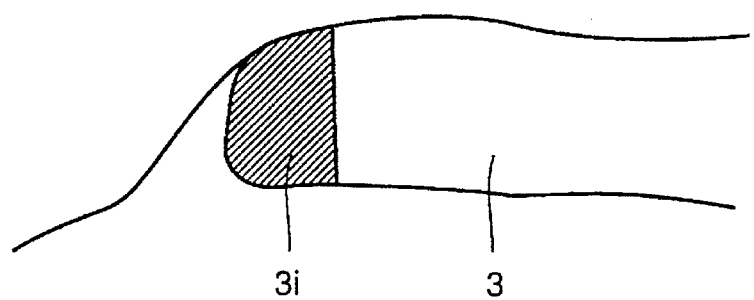
Figure 17:
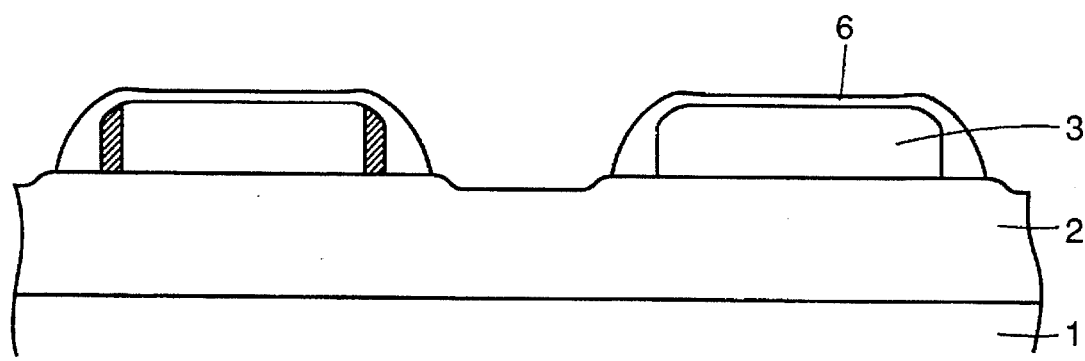
Figure 18:
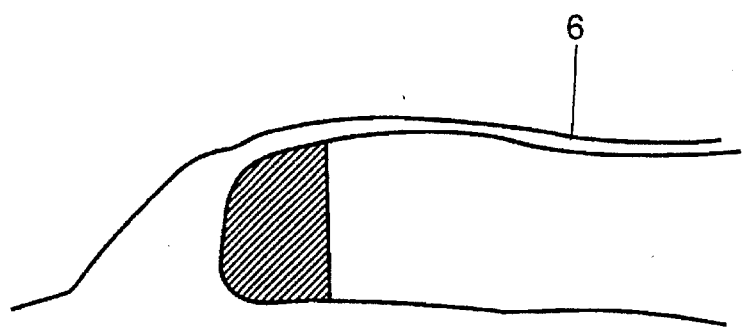

Then, pad oxide film 4 is removed and such shapes as shown in FIGS. 15 and 16 are obtained. A gate oxide layer 6 is then formed, as shown in FIGS. 17 and 18.

Figure 19:
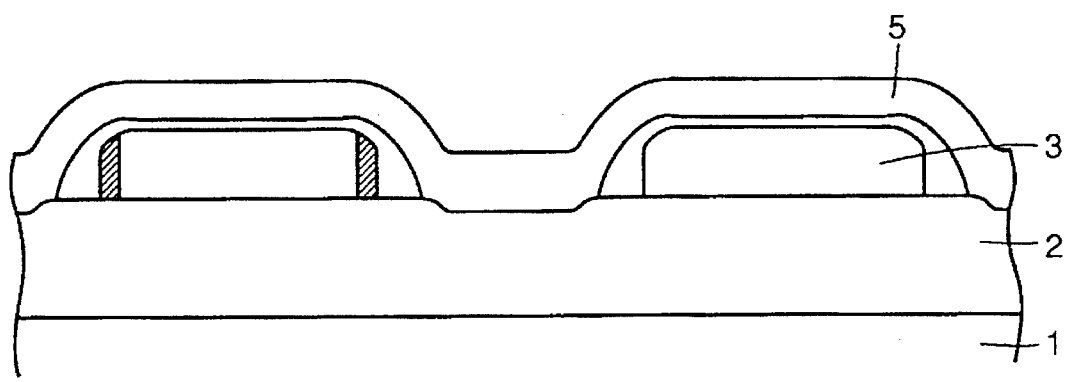
Figure 20:
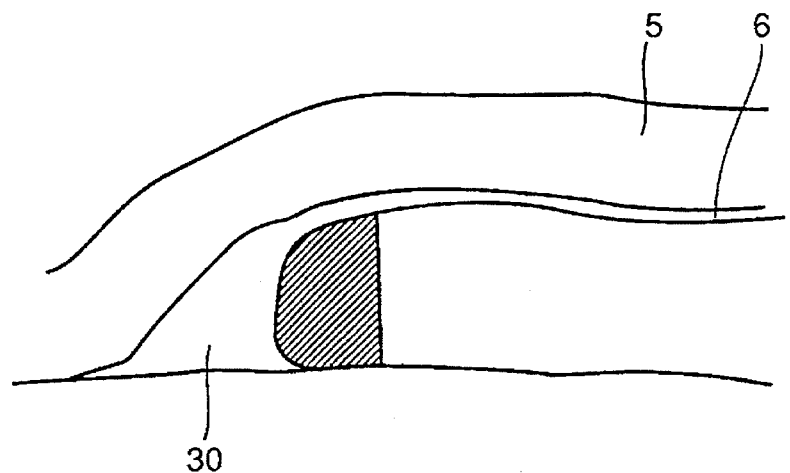

A polysilicon layer which serves a gate electrode is then deposited on the entire surface, as shown in FIGS. 19 and 20. In this step, as sidewall insulating film 30 exists at the side end of SOI layer 3, polysilicon layer 5 serving as the gate electrode can be efficiently prevented from intruding under the lower surface of SOI layer 3.

Then, after the similar process to the conventional process shown in FIGS. 62–70, the semiconductor device of the first embodiment is obtained.

Figure 21:
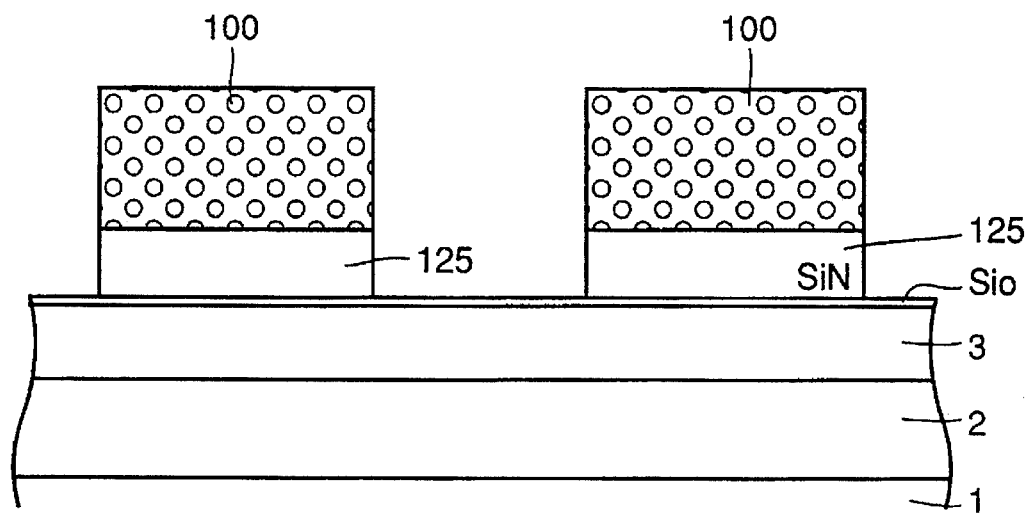
FIGS. 21, 22, 23 and 24 are cross sectional views illustrating the first, second, third and fourth steps of a second manufacturing process for the semiconductor device of the first embodiment, respectively.
Figure 44:
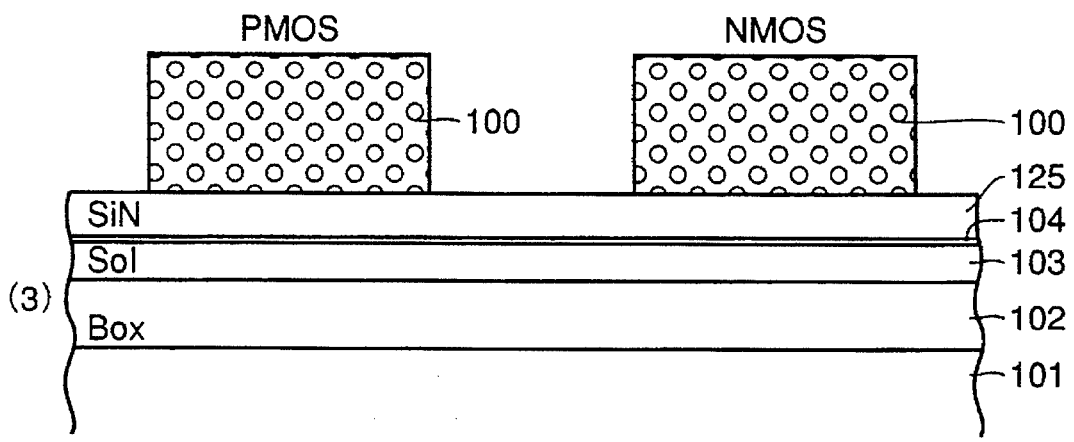
Figure 45:
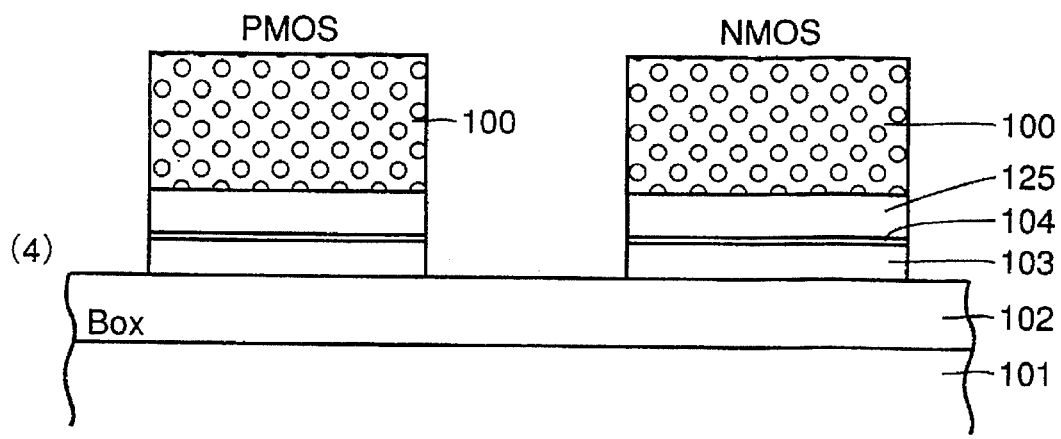
Figure 46:
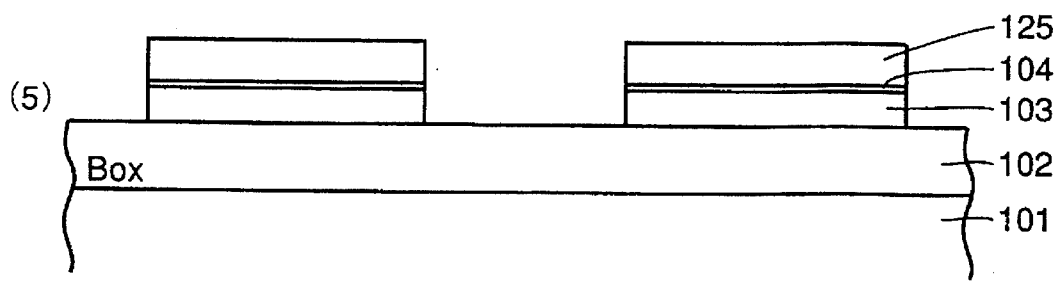
FIGS. 46 and 47, 48 and 49, 50 and 51, and 52 and 53 are cross sectional views illustrating the fifth, sixth, seventh and eighth steps of the conventional semiconductor device manufacturing process, respectively, the oddnumbered figures taken along line 600—600.

Referring to FIG. 21–38, a second manufacturing process for the semiconductor device of the first embodiment will now be described. FIG. 21 is the process following the manufacturing process shown in FIG. 44 of the conventional manufacturing method.

Figure 22:
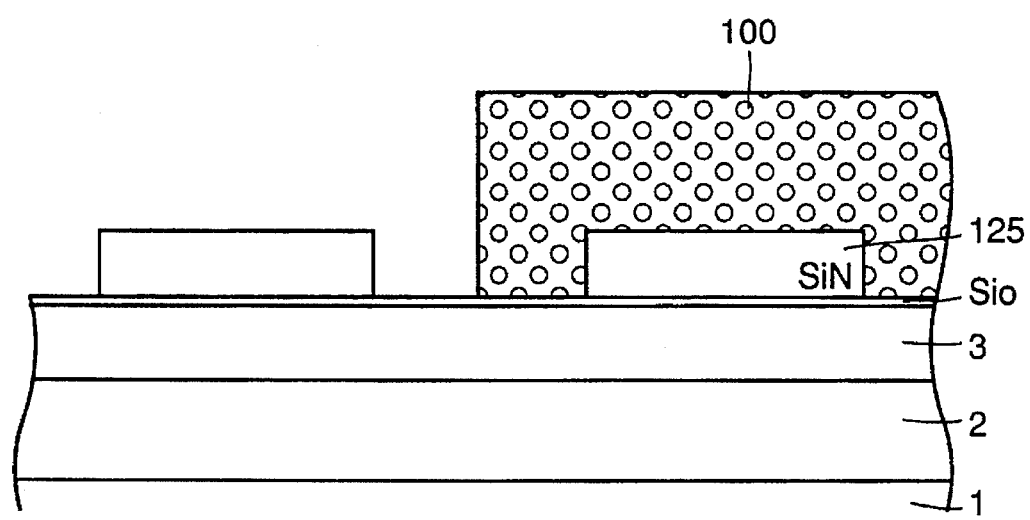

As shown in FIG. 21, resist 100 formed on a predetermined region of a main surface of the nitride film is used as a mask and nitride film 125 is etched. As shown in FIG. 22, resist 100 is formed only on the P-type MOS region.

Figure 23:
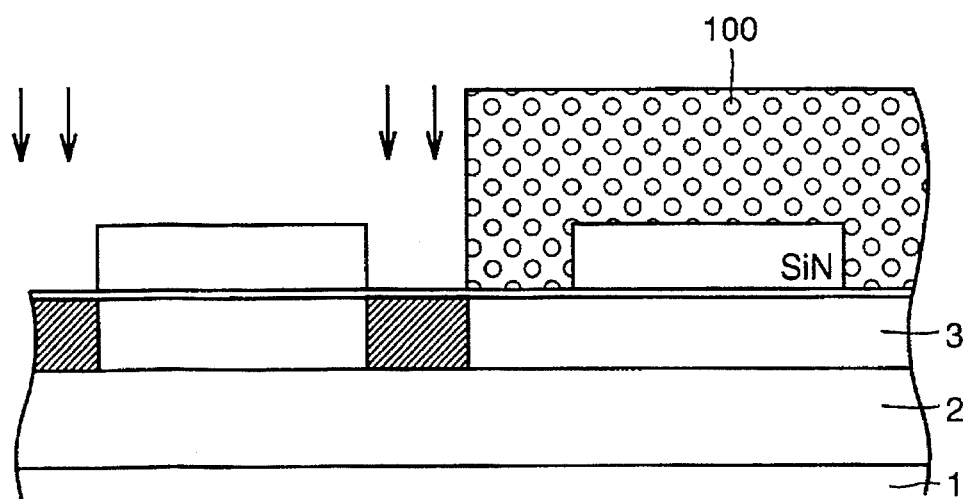

As shown in FIG. 23, resist 100 is used as a mask and boron ions are implanted into the N-type MOS region. This implantation serves as a channel implantation to a isolation region. This implantation allows increasing of threshold voltage of a patristic transistor which is formed in SOI layer 3 side wall.

Figure 24:
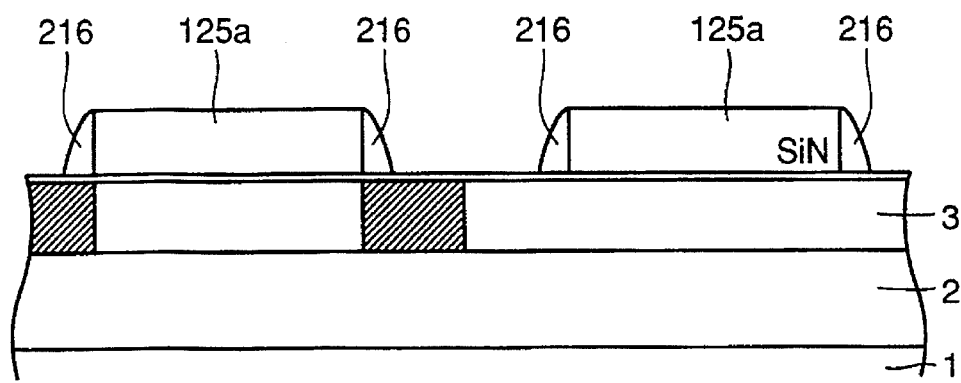
Figure 25:
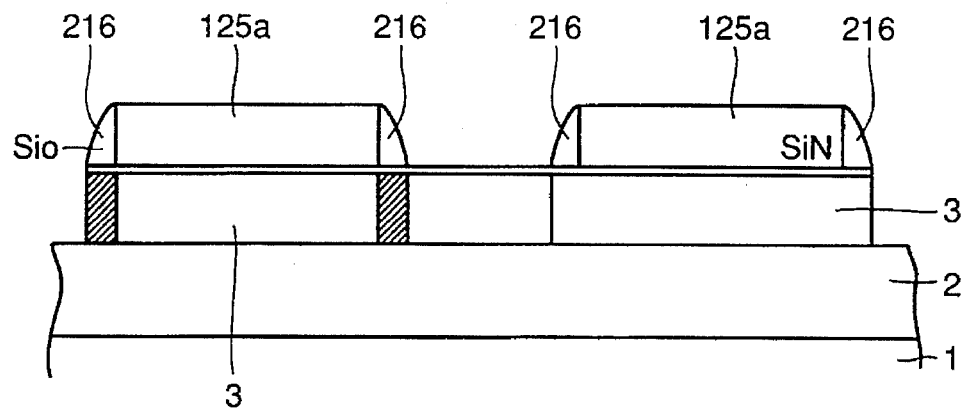
FIGS. 25 and 26, 27 and 28, 29 and 30, 31 and 32, 33 and 34, 35 and 36, and 37 and 38 are cross sectional views illustrating the fifth, sixth, seventh, eighth, ninth, tenth and eleventh steps of the second manufacturing process of the semiconductor device of the first embodiment, respectively, the even-numbered figures taken along line 600—600.
Figure 26:
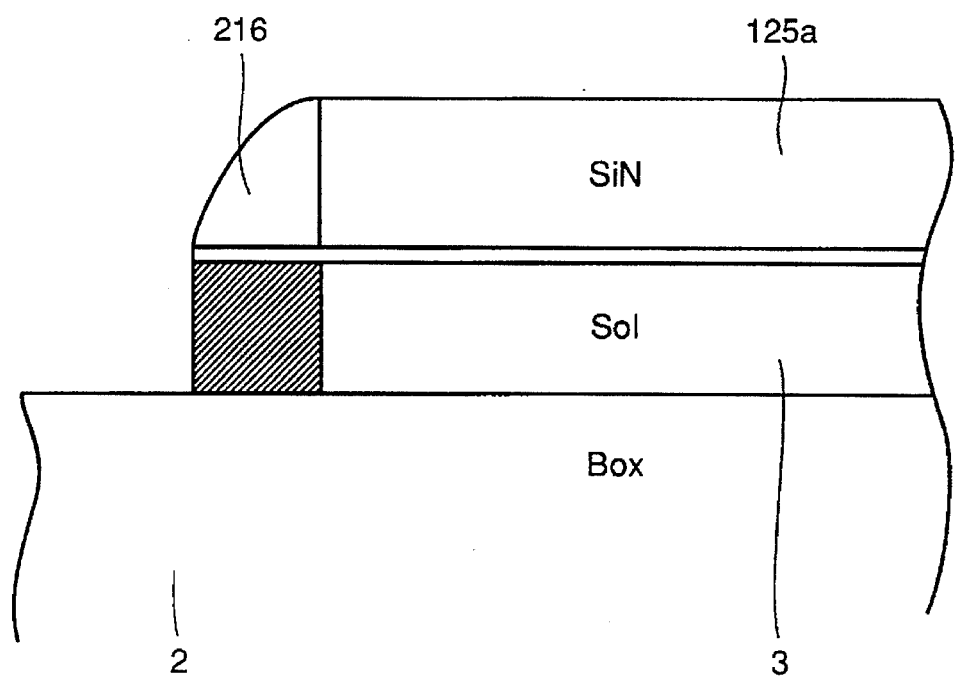

After resist 100 is removed, a sidewall insulating film 216 is formed on a side wall of nitride film 125a, as shown in FIG. 24. Then, as shown in FIG. 25, nitride film 125a and sidewall insulating film 216 are used as a mask and SOI layer 3 is selectively removed by dry-etching. A cross sectional view of the stage shown in FIG. 25, taken along line 600—600, is shown in FIG. 26. Sidewall insulating film 216 is formed at a side end portion of nitride film 125a. High impurity concentration region 3i is also formed in the vicinity of SOI layer 3 side wall.

Figure 27:
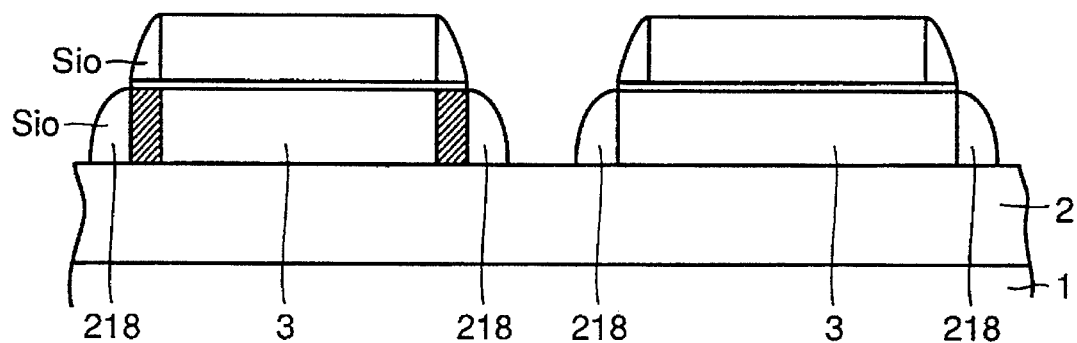
Figure 28:
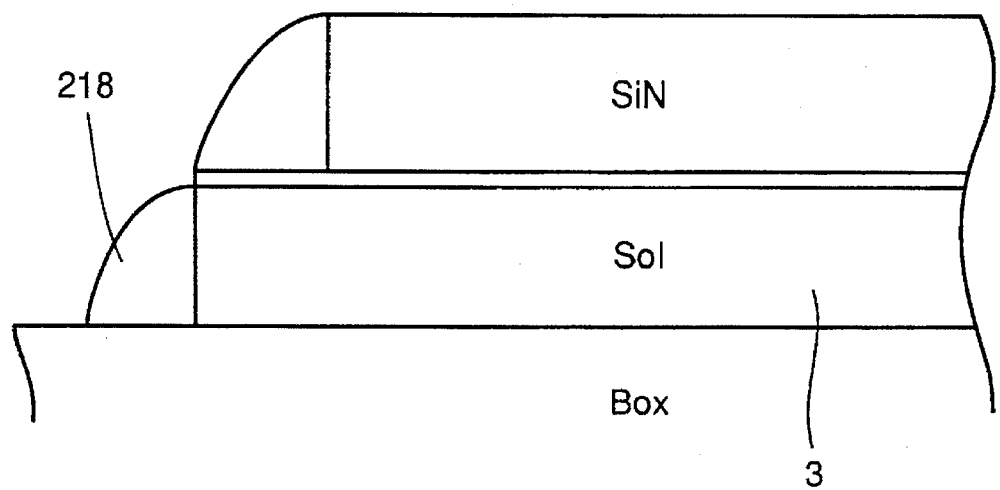
Figure 29:
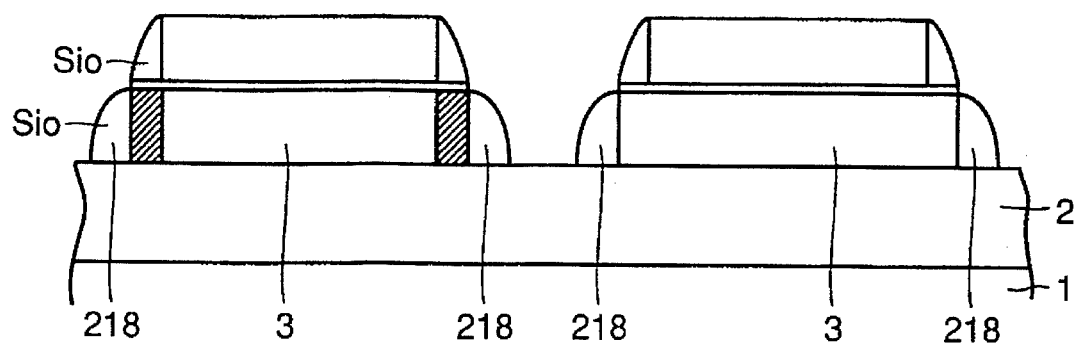
Figure 30:
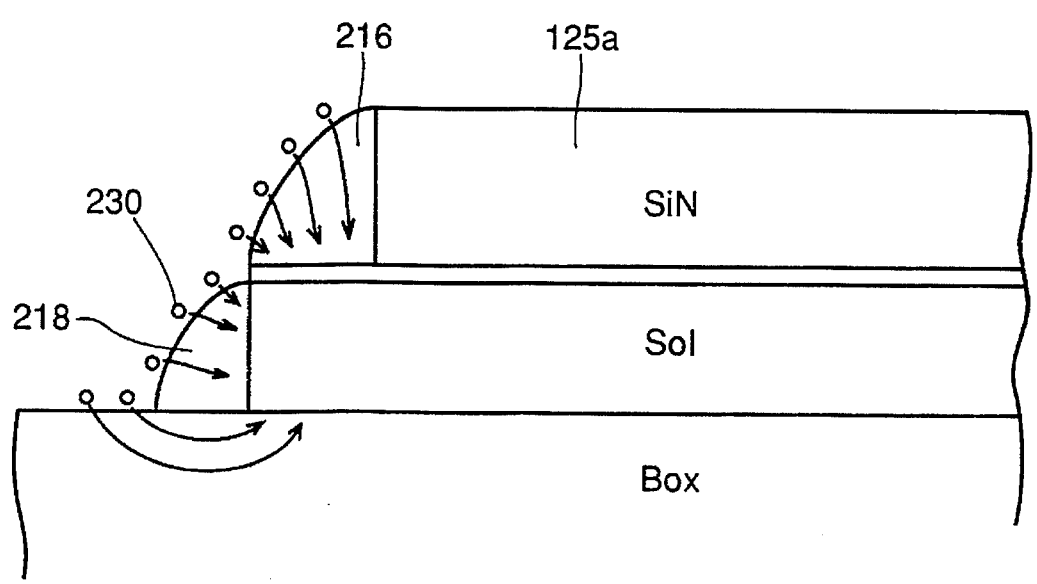

As shown in FIG. 27, a sidewall insulating film 218 is formed on the side wall of SOI layer 3. FIG. 28 is a cross sectional view of the stage shown in FIG. 27, taken along line 600—600. Sidewall insulating film 218 is formed on the side wall of SOI layer 3. Then, the side wall of SOI layer 3 is oxidized as shown in FIGS. 29 and 30. FIGS. 29 and 30 are cross sectional views taken along lines 500—500 and 600—600. The oxidation is performed at a temperature of 950°–1300° C. as with the first embodiment. By this oxidation reaction, the side wall of SOI layer 3 is oxidized. With this oxidizing of the side wall, in addition to the effect described in the first embodiment, because of sidewall insulating film 216 formed on the side end of the nitride film, upper surface of SOI layer 3 side end comes to have more preferable shape than that of the first embodiment. In other words, since oxidizing agent 230 is more easily diffused in sidewall insulating film 216 than in nitride film 215a during the oxidizing process, SOI layer 3 is further oxidized at a corner of the upper surface of the side end, compared with the first embodiment. As a result, the upper side end of SOI layer 3 is further rounded and electric field concentration at SOI layer 3 upper side end can further be relaxed. Furthermore, when a shape similar to the first embodiment is formed, the time required for oxidation can be effectively reduced.

Figure 31:
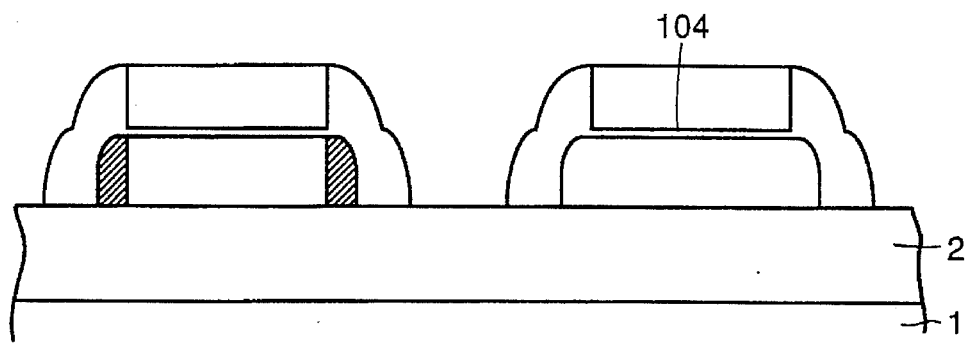
Figure 32:
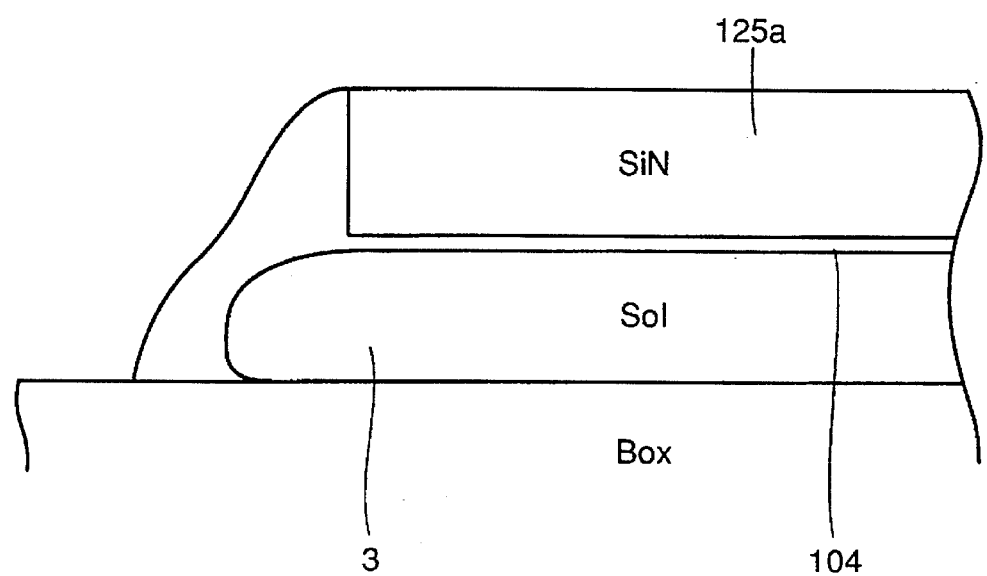

FIGS. 30–32 are cross sectional views of a state in which the oxidation reaction is completed. FIG. 31 and 32 are cross sectional views taken along lines 500—500 and 600—600, respectively. Referring to FIGS. 32, it can be seen that, as described above, the corner of SOI layer 3 upper side end is more round and less sharp than that of the first embodiment.

Figure 33:
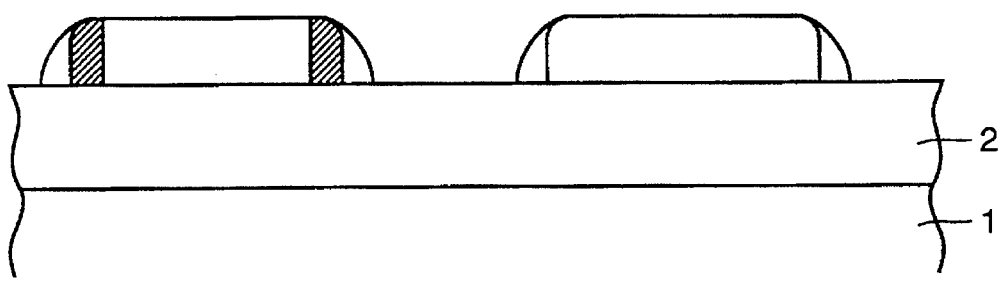
Figure 34:
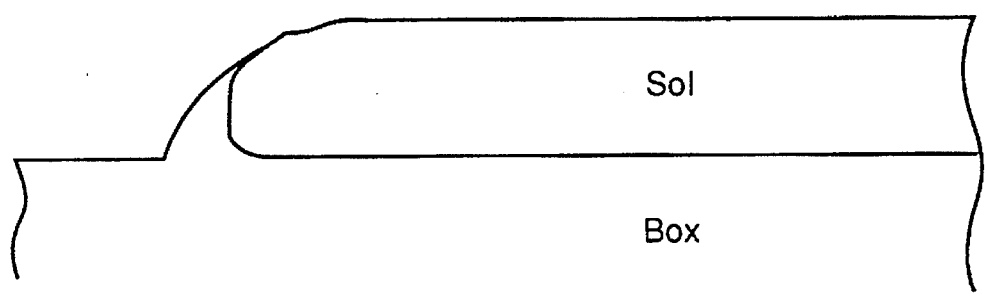
Figure 35:
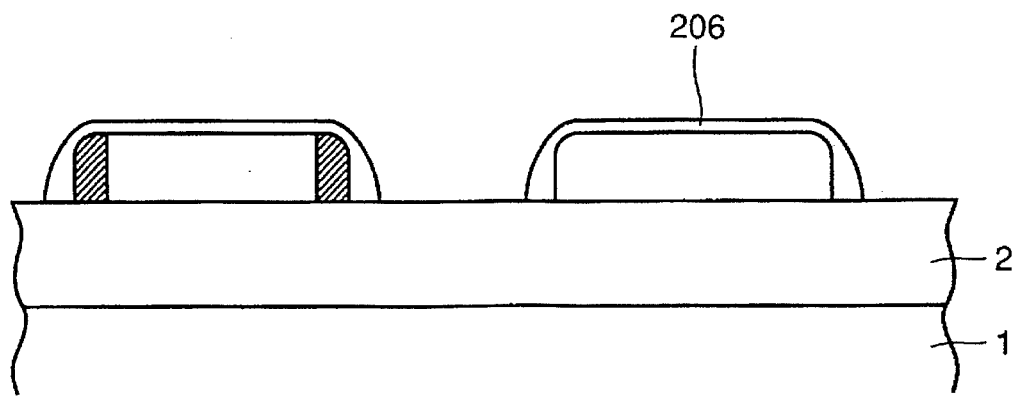
Figure 36:
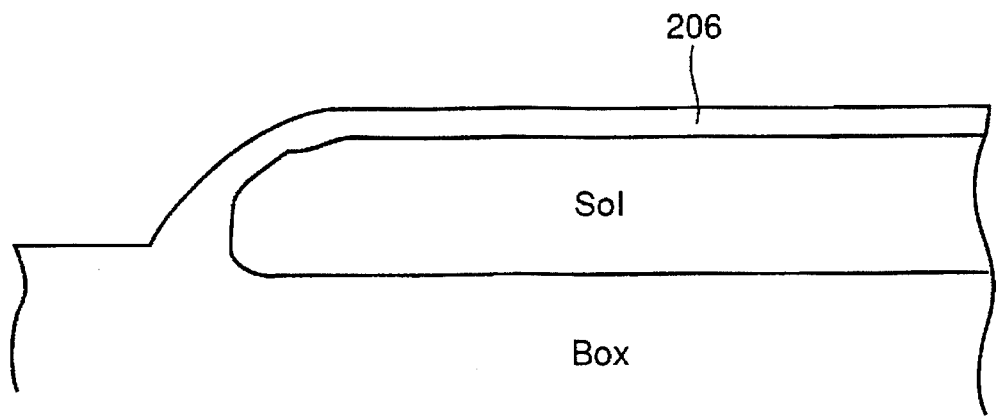
Figure 37:
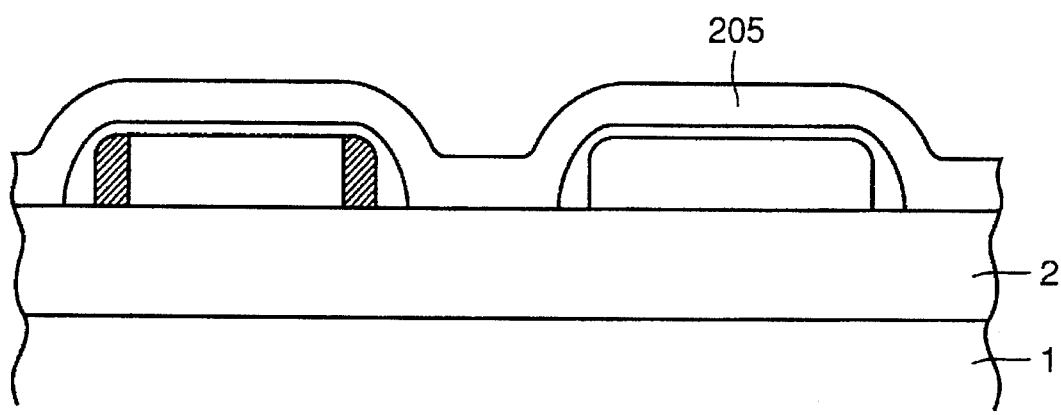
Figure 38:
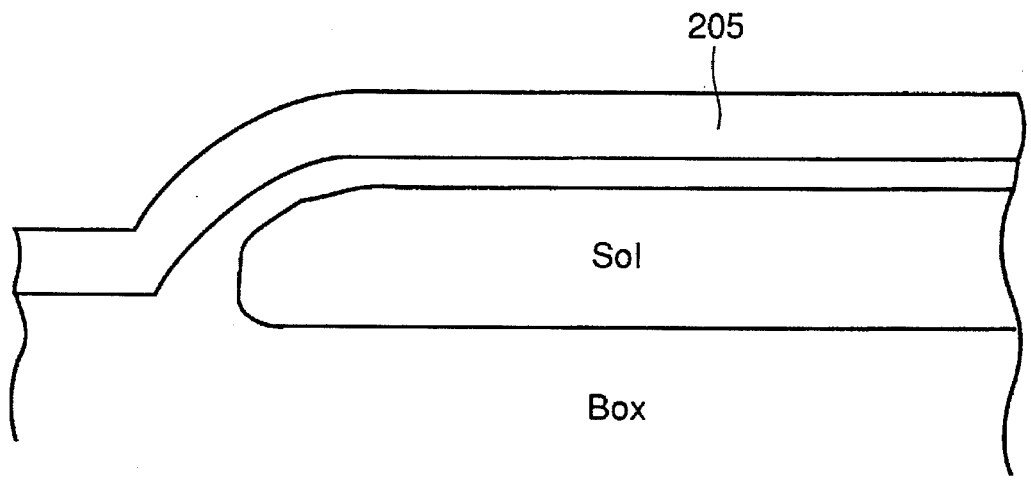

Then, nitride film 125a is removed using hot phosphoric acid and pad oxide film 104 is removed as shown in FIGS. 33 and 34. As shown in FIGS. 35 and 36, a gate insulating film 206 is formed. A polysilicon layer 205 which serves as a gate electrode is then deposited, as shown in FIGS. 37 and 38.

Then, by the conventional process shown in FIGS. 62–70, the semiconductor of the first embodiment is similarly completed.

Thus, in the semiconductor device according to one aspect of the present invention, since the semiconductor layer is not curved upward and defect due to stress can be prevented, leakage current caused by the defect due to the stress in the curved portion can be decreased and a reliable semiconductor device can be obtained. Furthermore, as the semiconductor layer is rounded at a lower side end, electric field concentration can be prevented and degradation in subthreshold voltage can be prevented. Furthermore, as a high impurity concentration region is formed in a side of the semiconductor layer, threshold voltage of a parasitic transistor formed in the side wall of the semiconductor layer can be increased, thereby obtaining a reliable semiconductor device.

In the semiconductor device manufacturing method according to another aspect of the present invention, a pad oxide film is formed on an upper surface of the semiconductor layer, a nitride film is formed on the pad oxide film, a first sidewall insulating film is formed on a side of the semiconductor layer in such a manner that its width is increased toward its lower portion and after forming the first sidewall insulating film, the semiconductor layer is oxidized by using the nitride film as a mask, and hence the semiconductor layer is not curved upward at its end. This prevents defect due to stress from occurring in the semiconductor layer. Also, as a gate electrode layer does not intrude under the lower surface of the semiconductor layer, leakage current and therefore, degradation of subthreshold voltage can be prevented. Furthermore, as the semiconductor layer is adapted to be oxidized at or above 1100° C., stress can be reduced in the upper and lower side ends of the semiconductor layer, thereby reducing leakage current and obtaining a reliable semiconductor device. Furthermore, as the semiconductor layer is oxidized after a second sidewall insulating film is formed on a side wall of the nitride film, oxidation of the semiconductor layer is further promoted at the upper surface of its side end and electric field concentration can further be relaxed. Furthermore, as impurity is ion-implanted into the vicinity of the side of the semiconductor layer prior to the formation of the first sidewall insulating film, threshold voltage of a parasitic transistor formed in the side wall of the semiconductor layer can be increased and a reliable semiconductor device can be manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor layer formed on an insulating layer and having an upper side end rounded in a cross section along the direction of a channel width;
   a first sidewall insulating film contacting a side of said semiconductor layer in a cross section along the direction of said channel width and formed with its width increased toward an lower portion; and
   a gate electrode layer formed on and along an upper surface of said semiconductor layer and a surface of said first sidewall insulating film; wherein
   said semiconductor layer has a round lower end portion in a cross section along the direction of said channel width.

2. The semiconductor device according to claim 1, wherein
   a gate insulating film is interposed between said gate electrode layer and said semiconductor layer and an upper end of said first sidewall insulating film is formed continuously with said gate insulating film.

3. The semiconductor device according to claim 1, wherein
   a second sidewall insulating film is formed to contact a side of said gate electrode layer in the cross section along the direction of a channel length.

4. The semiconductor device according to claim 1, wherein
   a silicide layer is formed at a predetermined region on a main surface of said semiconductor layer and on an upper surface of said gate electrode layer.

5. The semiconductor device according to claim 1, wherein
   a high impurity concentration region is formed in a side of said semiconductor layer positioned under said gate electrode layer in the cross section along the direction of said channel width.

* * * * *